US012666804B2

(12) United States Patent
Kusunoki et al.

(10) Patent No.: US 12,666,804 B2
(45) Date of Patent: Jun. 23, 2026

(54) DISPLAY DEVICE

(71) Applicant: Semiconductor Energy Laboratory Co., Ltd., Atsugi (JP)

(72) Inventors: Koji Kusunoki, Isehara (JP); Kazunori Watanabe, Machida (JP); Satoshi Yoshimoto, Isehara (JP); Tomoaki Atsumi, Hadano (JP); Daisuke Kubota, Atsugi (JP); Naoto Kusumoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 360 days.

(21) Appl. No.: 18/266,847

(22) PCT Filed: Dec. 14, 2021

(86) PCT No.: PCT/IB2021/061672
§ 371 (c)(1),
(2) Date: Jun. 13, 2023

(87) PCT Pub. No.: WO2022/137014
PCT Pub. Date: Jun. 30, 2022

(65) Prior Publication Data
US 2024/0049543 A1 Feb. 8, 2024

(30) Foreign Application Priority Data

Dec. 24, 2020 (JP) ................................. 2020-214983
Dec. 24, 2020 (JP) ................................. 2020-214985

(51) Int. Cl.
*H10K 59/122* (2023.01)
*H10K 59/131* (2023.01)
*H10K 59/80* (2023.01)

(52) U.S. Cl.
CPC ......... *H10K 59/122* (2023.02); *H10K 59/131* (2023.02); *H10K 59/1315* (2023.02); *H10K 59/80522* (2023.02); *H10K 59/873* (2023.02)

(58) Field of Classification Search
CPC ............. H10K 59/122; H10K 59/1315; H10K 59/80522
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 101055887 A 10/2007
CN 105470278 A 4/2016
(Continued)

OTHER PUBLICATIONS

International Search Report (Application No. PCT/IB2021/061672) Dated Mar. 8, 2022.
(Continued)

*Primary Examiner* — Christopher M Raabe
(74) *Attorney, Agent, or Firm* — Eric J. Robinson; Robinson Intellectual Property Law Office, P.C.

(57) ABSTRACT

A high-resolution display device with reduced display unevenness is provided. In the display device, a plurality of pixels are included over a substrate; each of the plurality of pixels includes a transistor and a light-emitting element; the light-emitting element includes a first electrode, an EL layer over the first electrode, and a second electrode over the EL layer; the first electrode is electrically connected to the transistor; in the plurality of pixels, the first electrodes in adjacent pixels are separated by an insulating layer; the second electrode includes a conductive material having
(Continued)

light-transmitting property with respect to visible light; the second electrode of each of the plurality of pixels is shared; and light is emitted from the second electrode side. A wiring is included; in a plane view with respect to the substrate, the wiring is placed in a region where the EL layer is not placed; and the second electrode is placed over and in contact with the wiring.

14 Claims, 19 Drawing Sheets

(58) Field of Classification Search
USPC ................................................. 313/498–512
See application file for complete search history.

(56) References Cited

U.S. PATENT DOCUMENTS

| | | | |
|---|---|---|---|
| 7,399,991 B2 | 7/2008 | Seo et al. | |
| 7,663,149 B2 | 2/2010 | Seo et al. | |
| 7,896,721 B2 | 3/2011 | Takei et al. | |
| 7,915,816 B2 | 3/2011 | Kashiwabara et al. | |
| 7,985,609 B2 | 7/2011 | Ito | |
| 8,003,417 B2 | 8/2011 | Li et al. | |
| 8,232,719 B2 | 7/2012 | Kashiwabara et al. | |
| 8,237,159 B2 | 8/2012 | Li et al. | |
| 8,436,530 B2 | 5/2013 | Kashiwabara et al. | |
| 8,455,893 B2 | 6/2013 | Ito | |
| 8,680,761 B2 | 3/2014 | Kashiwabara et al. | |
| 8,786,185 B2 | 7/2014 | Kashiwabara et al. | |
| 10,374,020 B2 | 8/2019 | Kang | |
| 10,636,853 B2 | 4/2020 | Kang | |
| 11,004,921 B2 | 5/2021 | Kang | |
| 2002/0072139 A1 | 6/2002 | Kashiwabara | |
| 2007/0241664 A1 | 10/2007 | Sakamoto et al. | |
| 2008/0116463 A1 | 5/2008 | Ito | |
| 2008/0284323 A1 | 11/2008 | Kashiwabara et al. | |
| 2009/0215350 A1 | 8/2009 | Takei et al. | |
| 2011/0148290 A1 | 6/2011 | Oota | |
| 2011/0248297 A1 | 10/2011 | Ito | |
| 2012/0252303 A1* | 10/2012 | Otsuka ............. H10K 59/80522 445/58 | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto. et al. | |
| 2015/0069360 A1 | 3/2015 | Sato | |
| 2015/0076476 A1 | 3/2015 | Odaka et al. | |
| 2016/0093680 A1 | 3/2016 | Paek et al. | |
| 2016/0172595 A1 | 6/2016 | Malinowski et al. | |
| 2016/0211478 A1 | 7/2016 | Nirengi et al. | |
| 2016/0315133 A1 | 10/2016 | Sato | |
| 2017/0141167 A1 | 5/2017 | Naganuma | |
| 2017/0194396 A1 | 7/2017 | Choe | |
| 2017/0256754 A1 | 9/2017 | Defranco et al. | |
| 2018/0114818 A1 | 4/2018 | Paek et al. | |
| 2018/0138251 A1 | 5/2018 | Kang | |
| 2018/0190908 A1 | 7/2018 | Ke et al. | |
| 2018/0254308 A1 | 9/2018 | Choe | |
| 2019/0326373 A1 | 10/2019 | Kang | |
| 2020/0144529 A1 | 5/2020 | Lee et al. | |
| 2020/0203662 A1 | 6/2020 | Mollard et al. | |
| 2020/0227493 A1 | 7/2020 | Kang | |
| 2021/0320277 A1* | 10/2021 | Wang ................. H10K 59/1315 | |
| 2025/0008778 A1* | 1/2025 | Lee ...................... H10K 59/122 | |

FOREIGN PATENT DOCUMENTS

| | | |
|---|---|---|
| CN | 105474752 A | 4/2016 |
| CN | 108074953 A | 5/2018 |
| CN | 111162103 A | 5/2020 |
| EP | 3321988 A | 5/2018 |
| EP | 4192219 A | 6/2023 |
| JP | 2000-036385 A | 2/2000 |
| JP | 2002-324673 A | 11/2002 |
| JP | 2003-059663 A | 2/2003 |
| JP | 2007-287354 A | 11/2007 |
| JP | 2008-098106 A | 4/2008 |
| JP | 2008-146026 A | 6/2008 |
| JP | 2008-147072 A | 6/2008 |
| JP | 2008-251270 A | 10/2008 |
| JP | 2009-218220 A | 9/2009 |
| JP | 2009-231264 A | 10/2009 |
| JP | 2014-120218 A | 6/2014 |
| JP | 2014-135251 A | 7/2014 |
| JP | 2014-232568 A | 12/2014 |
| JP | 2015-065161 A | 4/2015 |
| JP | 2015-115178 A | 6/2015 |
| JP | 2015-222728 A | 12/2015 |
| JP | 2016-174007 A | 9/2016 |
| JP | 2016-197494 A | 11/2016 |
| JP | 2018-081903 A | 5/2018 |
| JP | 2019-179696 A | 10/2019 |
| JP | 2020-160305 A | 10/2020 |
| KR | 2016-0037369 A | 4/2016 |
| KR | 2016-0047476 A | 5/2016 |
| KR | 2017-0082188 A | 7/2017 |
| KR | 2018-0054983 A | 5/2018 |
| KR | 2020-0053071 A | 5/2020 |
| TW | 201041430 | 11/2010 |
| WO | WO-2015/030125 | 3/2015 |
| WO | WO-2022025173 A1* | 2/2022 ........... H10K 59/805 |

OTHER PUBLICATIONS

Written Opinion (Application No. PCT/IB2021/061672) Dated Mar. 8, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 :

(56)     References Cited

OTHER PUBLICATIONS

SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
Taiwanese Office Action (Application No. 110146721) dated Aug. 21, 2025.

* cited by examiner 101  111                                                    131

101  111  112Rf                                             131

101  111  112Rf  143a                                       131

101  111  112R  143a                                        131

101  111  112R  143a    112Gf                              131

101  111  112R  143a    112Gf 143b                         131

101  111  112R  143a    112G  143b   131

101  111  112R  143a    112G  143b   131        112Bf 101  111  112R  143a        112G  143b  131        112Bf  143c 101  111  112R  143a        112G  143b 131        112B  143c 101  111  112R        112G        131        112B

FIG. 7A
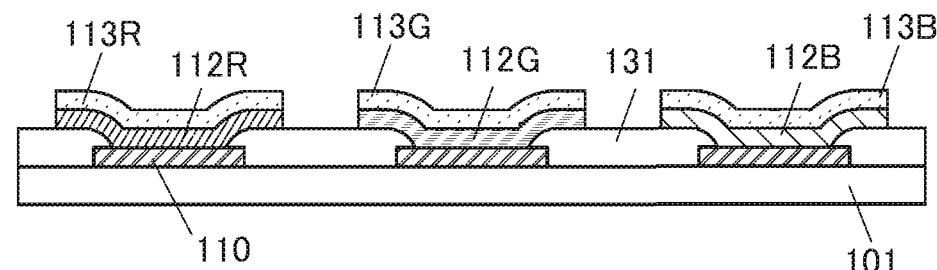
FIG. 7B
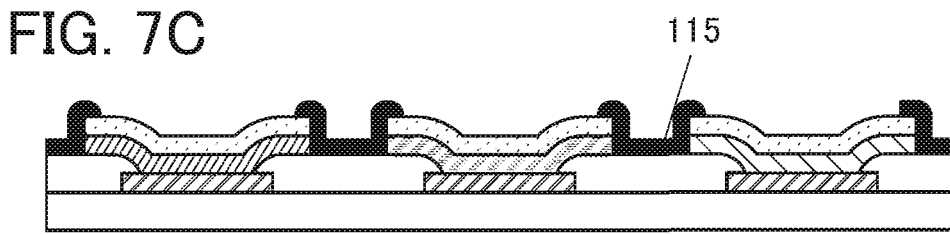
FIG. 7C
FIG. 7D
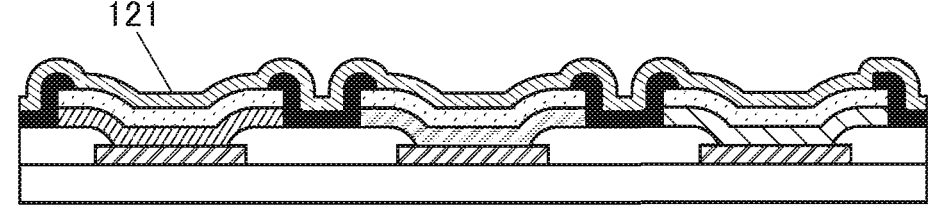

FIG. 16A
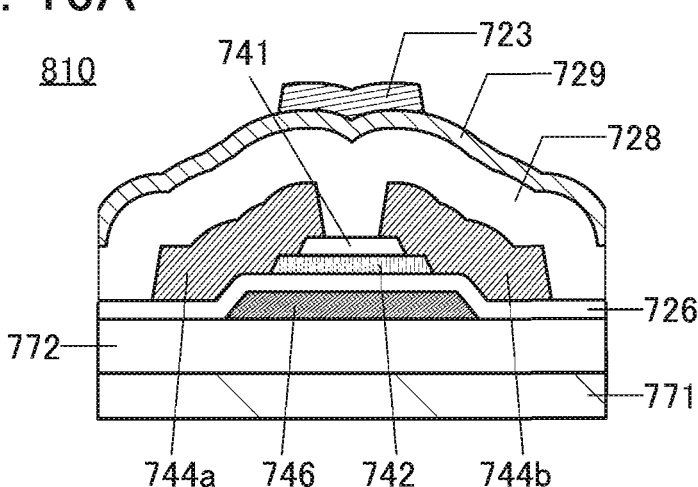
810
741    723    729    728    726    772    771
744a    746    742    744b
FIG. 16B
820
741    723    729    728    726    772    771
744a    746    742    744b
FIG. 16C
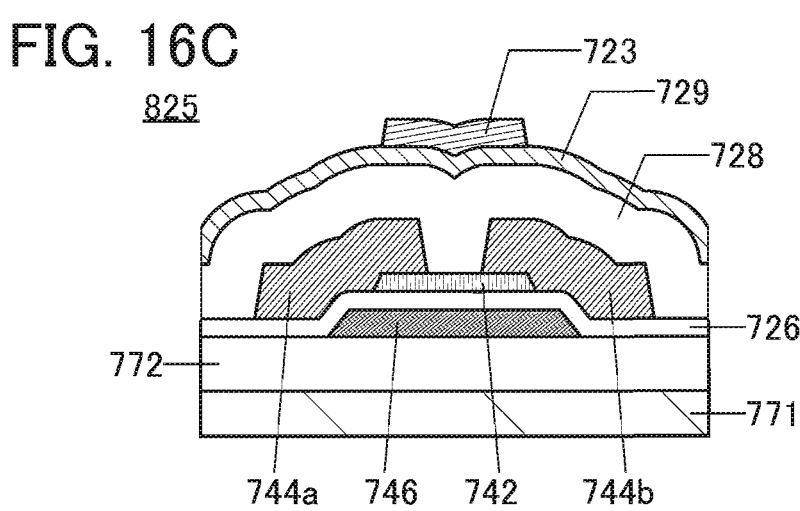
825
723    729    728    726    772    771
744a    746    742    744b FIG. 19A
7100
7101
7000
7103
7111
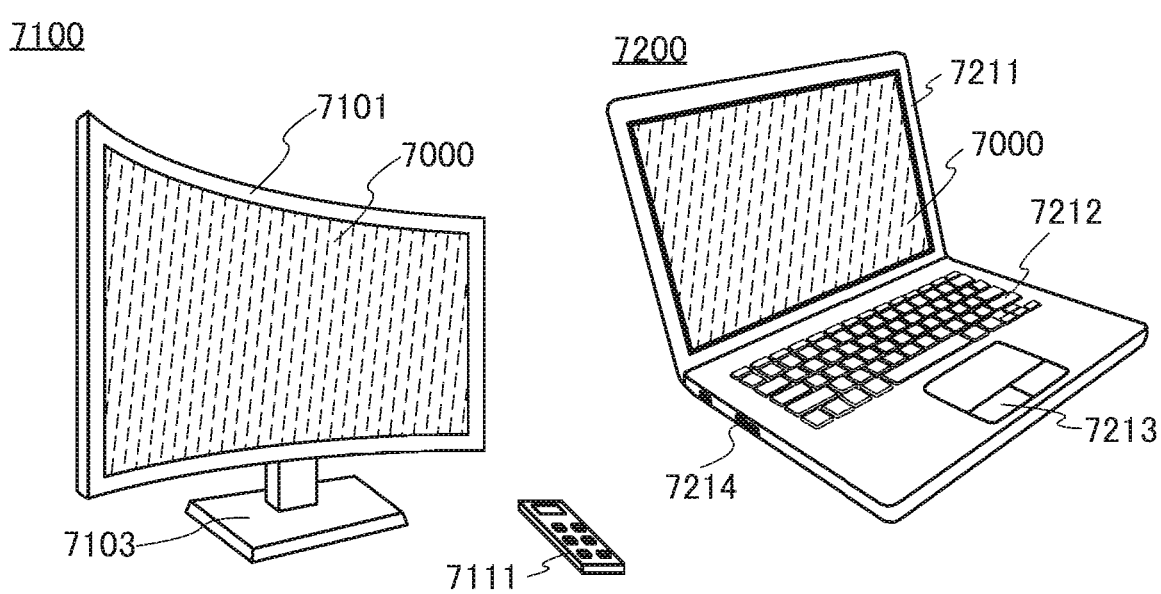
FIG. 19B
7200
7211
7000
7212
7213
7214
FIG. 19C
7300
7301
7303
7000
7311
FIG. 19D
7400
7401
7000
7411
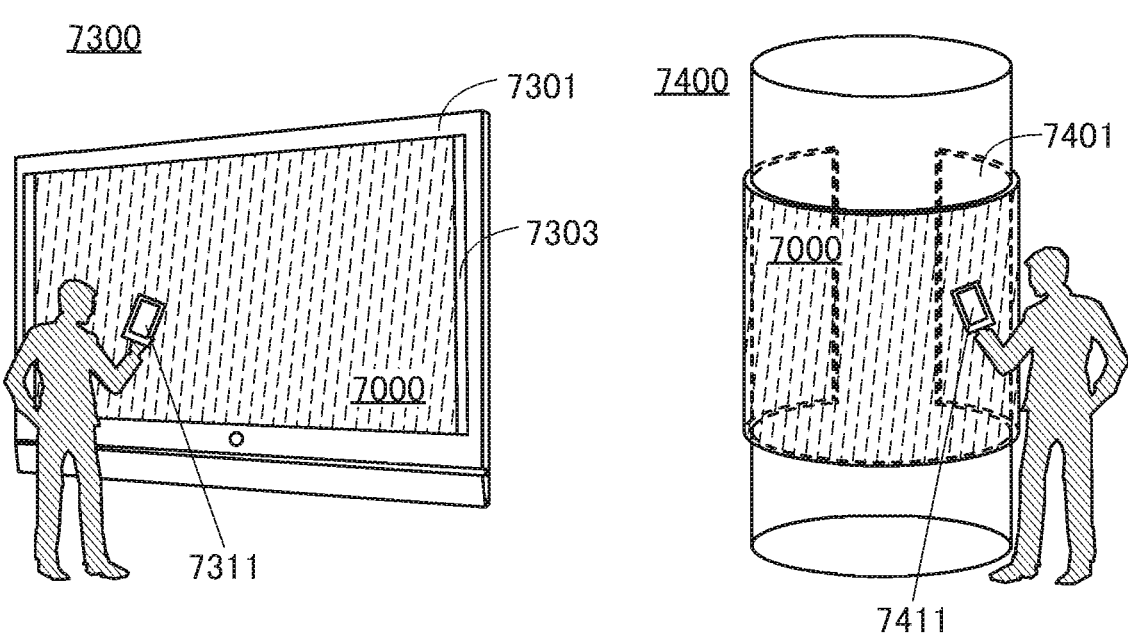

DISPLAY DEVICE

TECHNICAL FIELD

One embodiment of the present invention relates to a display device and a manufacturing method thereof.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting apparatus, a lighting device, a power storage device, a memory device, an imaging device, an operation method thereof, and a manufacturing method thereof.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with a higher definition. An example of a device that requires the highest level of resolution includes a device for virtual reality (VR) or augmented reality (AR).

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying a voltage to this element, light emission can be obtained from the light-emitting organic compound. A display device in which such an organic EL element is placed in each pixel does not need a backlight that is necessary for a liquid crystal display device and the like; thus, a thin, lightweight, high-contrast, and low-power display device can be achieved. An example of a display device using an organic EL element is disclosed in Patent Document 1.

REFERENCE

Patent Document

[Patent Document 1] Japanese Published Patent Application No. 2002-324673

SUMMARY OF THE INVENTION

Problems to be Solved by the Invention

As an organic EL display device capable of full-color display, a structure in which a white light-emitting device and color filters are combined and a structure in which red, green, and blue light-emitting devices are formed in the same plane are known.

The latter structure is ideal in terms of power consumption, and light-emitting materials are separately deposited using a metal mask or the like in manufacture of small- and medium-sized panels under the existing circumstances. However, since alignment accuracy is low in a process using a metal mask, it is needed to reduce an area occupied by a light-emitting element in a pixel and widen a distance between the light-emitting elements included in pixels next to each other. Accordingly, the occupied area of the light-emitting element in the pixel is reduced, and the pixel density is decreased, whereby it becomes difficult to obtain a higher-resolution display device.

In view of the above, an object of one embodiment of the present invention is to improve an occupied area of a light-emitting element in a pixel and to increase the pixel density.

When a plurality of pixels share one of a pair of electrodes of the light-emitting elements (hereinafter, the shared electrode is also referred to as a common electrode), the degree of a voltage drop of the common electrode greatly varies depending on the position of the pixel in a display region as the area of the display region of the display device is increased, resulting in a variation in the potential of the common electrode and generation of display unevenness. In particular, in the case where a conductive material having light-transmitting property with respect to visible light (hereinafter referred to as a light-transmitting conductive material) such as indium oxide-tin oxide (ITO: Indium Tin Oxide) is used as the common electrode to extract, from the common electrode side, light emitted from the light-emitting elements, resistivity of the common electrode tends to be higher than that of the common electrode using a metal material. Thus, the potential of the common electrode might greatly vary.

In view of this, an object of one embodiment of the present invention is to reduce display unevenness in a display region.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to a display device and a manufacturing method thereof.

One embodiment of the present invention relates to a display device which can be obtained by forming a light-emitting element without using a metal mask, and a manufacturing method thereof.

One embodiment of the present invention relates to a display device including a common electrode formed using a light-transmitting conductive material and a manufacturing method thereof. Another embodiment of the present invention relates to a display device including a wiring which is electrically connected to the common electrode and which is made of a material whose resistivity is lower than that of the common electrode (hereinafter, such wiring is also referred to as an auxiliary wiring), and a manufacturing method thereof. Another embodiment of the present invention relates to a display device having a structure in which an auxiliary wiring is placed to overlap with a region where a layer placed between a pair of electrodes of a light-emitting element (hereinafter, such layer is also referred to as an EL layer) is not provided in a plan view, and a manufacturing method thereof. Another embodiment of the present invention relates to a display device including an insulating layer having a function of separating the other of the pair of electrodes of the light-emitting elements (hereinafter, such insulating layer is also referred to as a partition wall) (hereinafter, such electrode is also referred to as a pixel electrode) and having a structure in which an auxiliary wiring is placed to overlap with the partition wall in a plan view, and a manufacturing method thereof. Another embodiment of the present invention relates to a display device having a structure in which a groove or an opening portion is formed in a part of a partition wall and an auxiliary wiring is placed to overlap with the groove or the opening portion in a plane view, and a manufacturing method thereof.

One embodiment of the present invention can be a display device in which a plurality of pixels are included over a substrate; each of the plurality of pixels includes a transistor and a light-emitting element; the light-emitting element includes a first electrode, an EL layer over the first electrode, and a second electrode over the EL layer; the first electrode is electrically connected to the transistor; in the plurality of pixels, the first electrodes in adjacent pixels are separated by an insulating layer; the second electrode includes a conductive material having light-transmitting property with respect to visible light; the second electrode of the plurality of pixels is shared; and light is emitted from the second electrode side. An auxiliary wiring can be included; in a plane view with respect to the substrate, the auxiliary wiring can be placed in a region which overlaps with the EL layer and a region which the EL layer is not placed in and overlaps with the insulating layer; and the second electrode can be placed over and in contact with the auxiliary wiring. Note that, in a plan view of a plurality of pixels, the auxiliary wiring may have a matrix shape or a stripe shape.

Another embodiment of the present invention can be a manufacturing method of a display device in which a plurality of pixels are included over a substrate; each of the plurality of pixels includes a transistor and a light-emitting element; the light-emitting element includes a first electrode, an EL layer over the first electrode, and a second electrode over the EL layer; the first electrode is electrically connected to the transistor; in the plurality of pixels, the first electrodes in adjacent pixels are separated by an insulating layer; the second electrode includes a conductive material having light-transmitting property with respect to visible light; the second electrode of the plurality of pixels is shared; and light is emitted from the second electrode side. In a plane view with respect to the substrate, an auxiliary wiring including a region which overlaps with the EL layer and a region which the EL layer is not placed in and overlaps with the insulating layer is formed; and the second electrode is formed over and in contact with the auxiliary wiring.

One embodiment of the present invention is a display device, including an auxiliary wiring between a first pixel and a second pixel that are placed to be adjacent to each other, in which the first pixel includes a first light-emitting element including a first electrode, a first EL layer over the first electrode, and an electrode having light-transmitting property with respect to visible light over the first EL layer; the second pixel includes a second light-emitting element including a second electrode, a second EL layer over the second electrode, and the electrode having light-transmitting property with respect to visible light over the second EL layer; an insulating layer that covers an end portion of the first electrode and an end portion of the second electrode and that is positioned below the first EL layer and below the second EL layer is included; the insulating layer includes a groove portion; the auxiliary wiring includes a region in contact with an inner wall of the groove portion; and the top surface of the first EL layer, the top surface of the second EL layer, and the top surface of the auxiliary wiring includes a region in contact with the electrode having light-transmitting property.

One embodiment of the present invention is a display device, including an auxiliary wiring between a first pixel and a second pixel that are placed to be adjacent to each other, in which the first pixel includes a first light-emitting element including a first electrode, a first EL layer over the first electrode, and an electrode having light-transmitting property with respect to visible light over the first EL layer; the second pixel includes a second light-emitting element including a second electrode, a second EL layer over the second electrode, and the electrode having light-transmitting property with respect to visible light over the second EL layer; an insulating layer that covers an end portion of the first electrode and an end portion of the second electrode and that is positioned below the first EL layer and below the second EL layer is included; the insulating layer includes an opening portion; the auxiliary wiring includes a region in contact with an inner wall of the opening portion; and each of the top surface of the first EL layer, the top surface of the second EL layer, and the top surface of the auxiliary wiring includes a region in contact with the electrode having light-transmitting property.

One embodiment of the present invention is a display device, including an auxiliary wiring between a first pixel and a second pixel that are placed to be adjacent to each other, in which the first pixel includes a first light-emitting element including a first electrode in contact with the top surface of a first insulating layer, a first EL layer over the first electrode, and an electrode having light-transmitting property with respect to visible light over the first EL layer; the second pixel includes a second light-emitting element including a second electrode in contact with the top surface of the first insulating layer, a second EL layer over the second electrode, and the electrode having light-transmitting property with respect to visible light over the second EL layer; a second insulating layer that is in contact with the top surface of the first insulating layer and that covers an end portion of the first electrode and an end portion of the second electrode is included; each of the first EL layer and the second EL layer includes a region in contact with the top surface of the second insulating layer; the second insulating layer includes an opening portion; the first insulating layer includes a groove portion in a region overlapping with the opening portion; the auxiliary wiring includes a region in contact with an inner wall of the opening portion and a region in contact with an inner wall of the groove portion; and each of the top surface of the first EL layer, the top surface of the second EL layer, and the top surface of the auxiliary wiring includes a region in contact with the electrode having light-transmitting property.

One embodiment of the present invention is a display device, including an auxiliary wiring between a first pixel and a second pixel that are placed to be adjacent to each other, in which the first pixel includes a first light-emitting element including a first electrode in contact with the top surface of a first insulating layer, a first EL layer over the first electrode, and an electrode having light-transmitting property with respect to visible light over the first EL layer; the second pixel includes a second light-emitting element including a second electrode in contact with the top surface of the first insulating layer, a second EL layer over the second electrode, and the electrode having light-transmitting property with respect to visible light over the second EL layer; a second insulating layer that is in contact with the top surface of the first insulating layer and that covers an end portion of the first electrode and an end portion of the second electrode is included; each of the first EL layer and the second EL layer includes a region in contact with the top surface of the second insulating layer; a first layer positioned below the first insulating layer is included; each of the second insulating layer and the first insulating layer includes an opening portion reaching the first layer; the auxiliary wiring includes a region in contact with the first layer in the opening portion; and each of the top surface of the first EL layer, the top surface of the second EL layer, and the top surface of the auxiliary wiring includes a region in contact with the electrode having light-transmitting property.

In the display device of one embodiment of the present invention, the top surface of the insulating layer may include a region in contact with the electrode having light-transmitting property with respect to visible light. Alternatively, in the display device of one embodiment of the present invention, the top surface of the second insulating layer may include a region in contact with the electrode having light-transmitting property with respect to visible light.

In the display device of one embodiment of the present invention, the opening portion may be filled with the auxiliary wiring.

Another embodiment of the present invention can be a manufacturing method of a display device in which a plurality of pixels are included over a substrate; each of the plurality of pixels includes a light-emitting element; the light-emitting element includes a first electrode, an EL layer over the first electrode, and a second electrode over the EL layer; in the plurality of pixels, the first electrodes in adjacent pixels are separated by an insulating layer; the second electrode includes a conductive material having light-transmitting property with respect to visible light; the second electrode of the plurality of pixels is shared; and light is emitted from the second electrode side. In a plane view with respect to the substrate, an auxiliary wiring is formed in a region which the EL layer is not placed in and which overlaps with an opening portion of the insulating layer; and the second electrode is formed over and in contact with the auxiliary wiring.

Effect of the Invention

The use of one embodiment of the present invention can improve the occupied area of the light-emitting element in a pixel and increase the pixel density. In this manner, a high-resolution display device can be obtained.

The use of one embodiment of the present invention can reduce display unevenness in a display region. In particular, display unevenness in the display region caused by electrical resistance of the common electrode using a light-transmitting conductive material can be reduced.

With the use of one embodiment of the present invention, a high-resolution display device with reduced display unevenness can be obtained.

Alternatively, a display device with low power consumption can be provided. Alternatively, a highly reliable display device can be provided. Alternatively, a novel display device or the like can be provided. Alternatively, a method for operating any of the above display devices can be provided. Alternatively, a novel semiconductor device or the like can be provided.

Note that the description of these effects does not preclude the existence of other effects. One embodiment of the present invention does not need to have all these effects. Note that other effects can be derived from the description of the specification, the drawings, and the claims.

BRIEF DESCRIPTION OF THE DRAWINGS

FIG. 7A to FIG. 7D are diagrams illustrating a display device and a manufacturing method of the display device.

FIG. 9A to FIG. 9D are diagrams illustrating a display device.

FIG. 14 is a diagram illustrating a display device.

FIG. 16A to FIG. 16C are diagrams illustrating transistors.

FIG. 19A to FIG. 19D are diagrams each illustrating an example of an electronic device.

MODE FOR CARRYING OUT THE INVENTION

Figure 1:
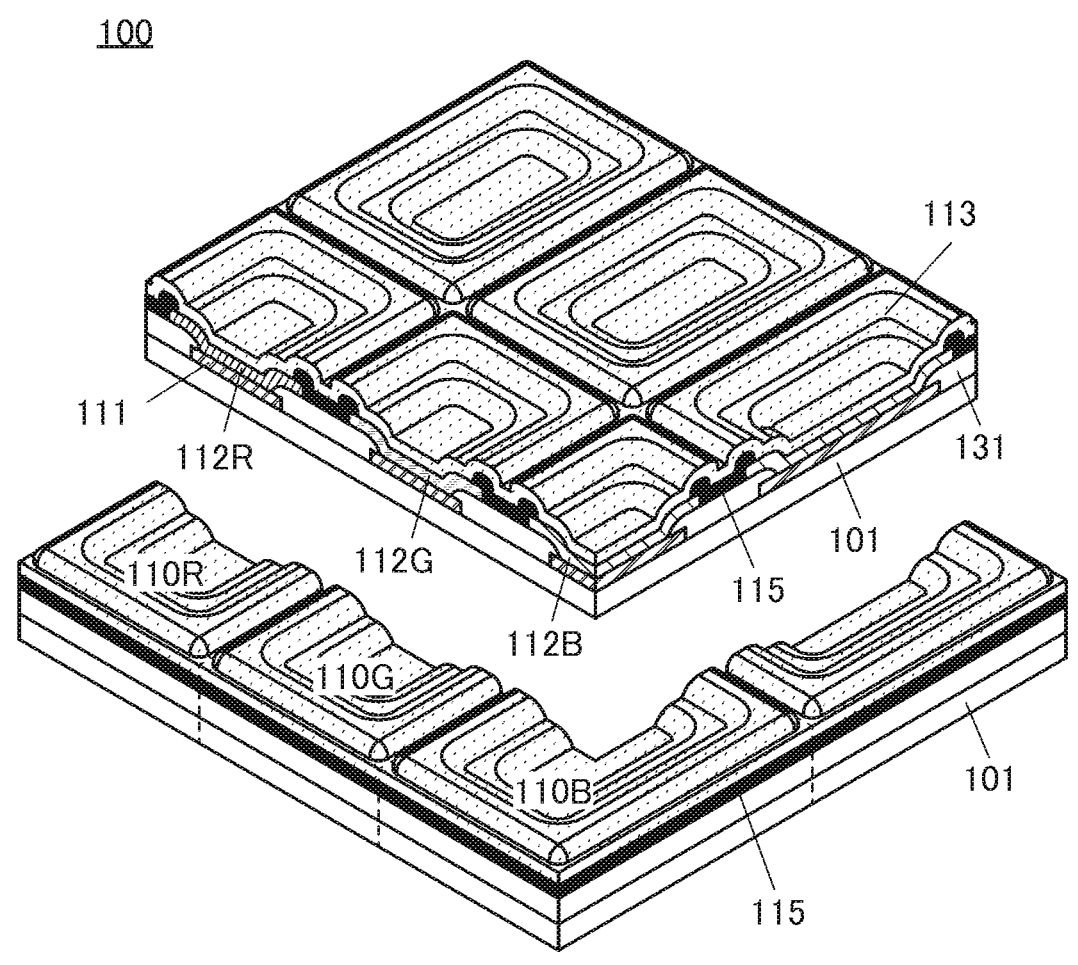
FIG. 1 is a perspective cross-sectional view illustrating a display device.

Embodiments are described in detail with reference to the drawings. Note that the present invention is not limited to the following description, and it will be readily understood by those skilled in the art that modes and details of the present invention can be modified in various ways without departing from the spirit and scope of the present invention. Thus, the present invention should not be interpreted as being limited to the descriptions of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In this specification and the like, a device formed using a metal mask or an FMM (a fine metal mask, a high-resolution metal mask) may be referred to as a device having an MM (a metal mask) structure. In this specification and the like, a device formed without using a metal mask or an FMM is sometimes referred to as a device having an MML (metal maskless) structure.

In this specification and the like, a structure in which light-emitting layers in light-emitting devices of different colors (here, blue (B), green (G), and red (R)) are separately formed or separately patterned is sometimes referred to as a side-by-side (SBS) structure. In this specification and the like, a light-emitting device capable of emitting white light may be referred to as a white-light-emitting device. Note that a white light-emitting device that is combined with coloring layers (e.g., color filters) can be a light-emitting device of full-color display.

Structures of light-emitting devices can be classified roughly into a single structure and a tandem structure. A device having a single structure includes one light-emitting unit between a pair of electrodes, and the light-emitting unit preferably includes one or more light-emitting layers. To obtain white light emission, two or more kinds of light-emitting layers are selected such that their emission colors are complementary. For example, when emission color of a first light-emitting layer and emission color of a second light-emitting layer are complementary colors, a structure in which the light-emitting device emits white light as a whole can be obtained. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is employed in which lights from light-emitting layers of a plurality of light-emitting units are combined to enable white light emission. Note that the structure for obtaining white light emission is similar to that in the case of a single structure. In the device having the tandem structure, it is preferable that an intermediate layer such as a charge-generation layer be provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. In the case of the device in which power consumption is required to be low, the light-emitting device having an SBS structure is preferably used. Meanwhile, the white-light-emitting device is preferable in terms of lower manufacturing cost or higher manufacturing yield because the manufacturing process of the white-light-emitting device is simpler than that of the light-emitting device having an SBS structure.

Note that the device having a tandem structure may include light-emitting layers each emitting light of the same color (e.g., BB, GG, RR, and the like). The tandem structure emitting light from a plurality of layers requires high voltage for light emission; however, the current value necessary for obtaining emission intensity at the same level as that of the single structure becomes small. Accordingly, with the tandem structure, current stress on each light-emitting unit can be reduced and the device lifetime can be extended.

Embodiment 1

In this embodiment, a structure of a display device of one embodiment of the present invention and a manufacturing method thereof will be described with reference to drawings.

Structure Example 1

Figure 2A:
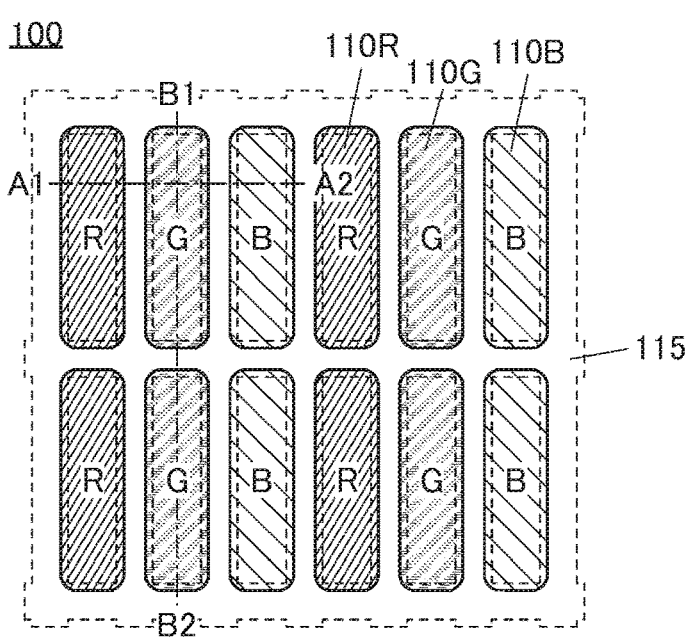
FIG. 2A to FIG. 2D are diagrams illustrating a display device.

FIG. 1 is a perspective cross-sectional view of a display device 100 of one embodiment of the present invention. FIG. 2A is a schematic top view of the display device 100 of one embodiment of the present invention. The display device 100 includes a plurality of light-emitting elements 100R exhibiting red, a plurality of light-emitting elements 100G exhibiting green, and a plurality of light-emitting elements 100B exhibiting blue. In FIG. 2A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 2A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

As the light-emitting element 110R, the light-emitting element 110G, and the light-emitting element 110B, an EL element such as an OLED (Organic Light Emitting Diode) or a QLED (Quantum-dot Light Emitting Diode) is preferably used. Examples of light-emitting substances contained in the EL element include a substance that emits fluorescent light (a fluorescent material), a substance that emits phosphorescent light (a phosphorescent material), an inorganic compound (e.g., a quantum dot material), and a substance that exhibits thermally activated delayed fluorescence (a thermally activated delayed fluorescent (TADF) material).

Figure 2B:
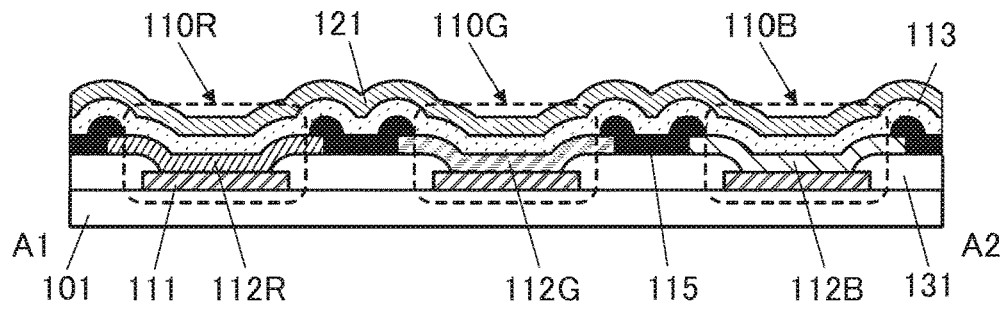
Figure 2C:
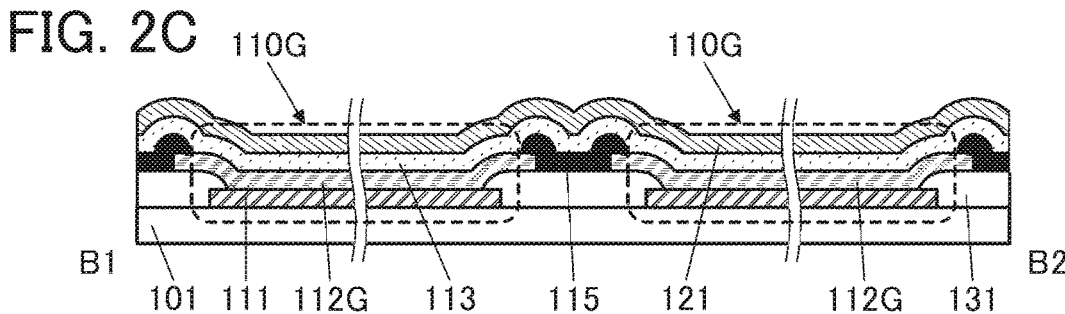

FIG. 2B is a cross-sectional schematic view taken along the dashed-dotted line A1-A2 in FIG. 2A, and FIG. 2C is a cross-sectional schematic view taken along the dashed-dotted line B1-B2.

FIG. 2B illustrates a cross section of the light-emitting element 110R, the light-emitting element 110G, and the light-emitting element 110B. Each of the light-emitting element 110R, the light-emitting element 110G, and the light-emitting element 110B is provided over a substrate 101 and includes a pixel electrode 111 which functions as an anode and a common electrode 113 which functions as a cathode. In addition, an auxiliary wiring 115 electrically connected to the common electrode 113 is provided. The auxiliary wiring 115 has a net-like shape (can also referred to as a lattice shape or a matrix shape) in a top view of a display region in FIG. 1 and FIG. 2A.

The light-emitting element 110R includes an EL layer 112R between the pixel electrode 111 and the common electrode 113. The EL layer 112R contains at least a light-emitting organic compound that emits light with a peak in a red wavelength range. An EL layer 112G included in the light-emitting element 110G contains at least a light-emitting organic compound that emits light with a peak in a green wavelength range. An EL layer 112B included in the light-emitting element 110B contains at least a light-emitting organic compound that emits light with a peak in a blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer).

The pixel electrode 111 is provided for each of the light-emitting elements. The common electrode 113 is provided as a common layer to the light-emitting elements. A conductive film having light-transmitting property with respect to visible light is used for either the pixel electrode 111 or the common electrode 113, and a reflective conductive film is used for the other. When the pixel electrode 111 is a light-transmitting electrode and the common electrode 113 is a reflective electrode, a bottom-emission display device can be obtained; in contrast, when the pixel electrode 111 is a reflective electrode and the common electrode 113 is a light-transmitting electrode, a top-emission display device can be obtained. Note that when both the pixel electrode 111 and the common electrode 113 transmit light, a dual-emission display device can be obtained. In this embodiment, an example of manufacturing atop-emission display device is described.

In order to insulate the adjacent pixel electrodes 111, an insulating layer 131 is provided to cover end portions of the pixel electrodes 111. The end portion of the insulating layer 131 is preferably tapered.

The EL layer 112R, the EL layer 112G, and the EL layer 112B each include a region in contact with the top surface of the pixel electrode 111 and a region in contact with a surface of the insulating layer 131. End portions of the EL layer 112R, the EL layer 112G, and the EL layer 112B are positioned over the insulating layer 131.

As illustrated in FIG. 2B, there is a gap between the two EL layers of the light-emitting elements with different colors. In this manner, the EL layer 112R, the EL layer 112G, and the EL layer 112G are preferably provided so as not to be in contact with each other. This suitably prevents unintentional light emission from being caused by current flowing through two adjacent EL layers. As a result, the contrast can be increased to achieve a display device with high display quality.

In this embodiment, the auxiliary wiring 115 is placed over the insulating layer 131. The auxiliary wiring 115 is electrically connected to the common electrode 113 and can contain a material with higher conductivity than that of the common electrode 113. In the structure illustrated in FIG. 1 and FIG. 2B, the top surface of the auxiliary wiring 115 is in contact with the common electrode 113, so that the auxiliary wiring 115 is electrically connected to the common electrode 113. In the structure illustrated in FIG. 1 and FIG. 2B, the auxiliary wiring 115 is placed over the EL layer so as to cover the end portion of the EL layer. The auxiliary wiring 115 is electrically connected to a cathode extraction terminal (not illustrated) on the outside of the display region.

Figure 2D:
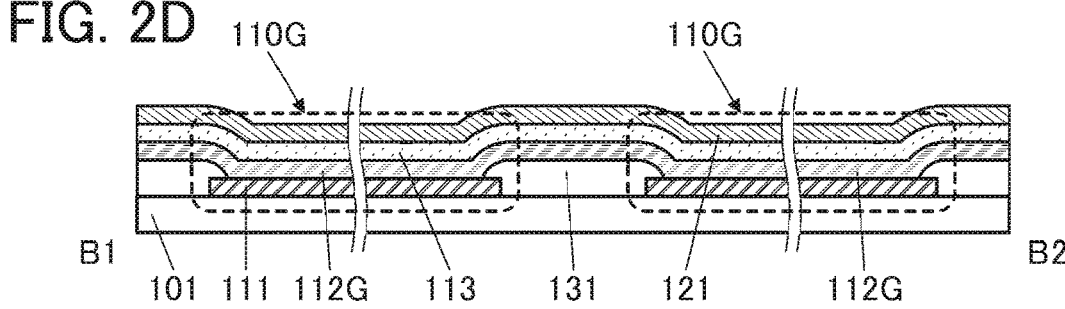

FIG. 2C illustrates an example in which the EL layer 112G is processed into an island shape. Note that, as illustrated in FIG. 2D, the EL layer 112G may be processed into a belt-like shape so as to be continuous in a column direction. When the EL layer 112G and the like are formed in a belt-like shape, no space is required for dividing the layer and thus a non-light-emitting area between the light-emitting elements can be reduced, resulting in an increased aperture ratio.

As illustrated in FIG. 2D, the auxiliary wiring 115 can be formed only between pixels exhibiting different colors without being provided between adjacent pixels exhibiting the same color. In this case, the auxiliary wiring 115 can have a stripe shape in a top view. When the auxiliary wiring 115 has a stripe shape, a space required for forming the auxiliary wiring 115 is not needed, different from the case where the auxiliary wiring 115 has a lattice shape, resulting in an increased aperture ratio. Furthermore, crosstalk between pixels exhibiting the same color can be reduced.

FIG. 2C and FIG. 2D shows the cross section of the light-emitting element 110G as an example; the light-emitting element 110R and the light-emitting element 110B can have a similar shape.

In addition, a protective layer 121 is provided over the common electrode 113 so as to cover the light-emitting element 110R, the light-emitting element 110G, and the light-emitting element 110B. The protective layer 121 has a function of preventing diffusion of impurities into the light-emitting elements from above.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

<Manufacturing Method Example>

Hereinafter, an example of a manufacturing method of the display device of one embodiment of the present invention will be described with reference to drawings. Description is made here using the display device 100 described in the above structure example, for example. FIG. 3A to FIG. 6E are schematic cross-sectional views of steps in the manufacturing method of the display device described as an example below.

Note that thin films forming the display device (insulating films, semiconductor films, conductive films, and the like) can be formed by a sputtering method, a chemical vapor deposition (CVD) method, a vacuum evaporation method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

A method such as spin coating, dipping, spray coating, ink-jetting, dispensing, screen printing, offset printing, a doctor knife method, slit coating, roll coating, curtain coating, or knife coating can be employed for application of the thin films that form the display device (insulating films, semiconductor films, conductive films, and the like).

When the thin films that form the display device are processed, a photolithography method or the like can be used. Alternatively, the thin films may be processed by a nanoimprinting method. A method in which island-shaped thin films are directly formed by a film formation method using a blocking mask may also be used.

There are two typical methods for processing a thin film using a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. Furthermore, as the light used for the exposure, extreme ultra-violet (EUV) light or X-rays may be used. Furthermore, instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, or the like can be used.

<Preparation for Substrate 101>

As the substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, an organic resin substrate, or the like can be used. Alternatively, it is possible to use a semiconductor substrate such as a single crystal semiconductor substrate or a polycrystalline semiconductor substrate formed using silicon, silicon carbide, or the like; a compound semiconductor substrate of silicon germanium or the like; or an SOI substrate.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

<Formation of Pixel Electrode 111>

Next, a plurality of pixel electrodes 111 are formed over the substrate 101. First, a conductive film to be the pixel electrodes 111 is formed, a resist mask is formed by a photolithography method, and an unnecessary portion of the conductive film is removed by etching. After that, the resist mask is removed, so that the pixel electrodes 111 can be formed.

For the pixel electrode 111, it is preferable to use a material (e.g., silver or aluminum) having reflectance as high as possible in the whole wavelength range of visible light. The pixel electrode 111 formed using the material can be referred to as an electrode having a light-reflecting property. This can increase color reproducibility as well as light extraction efficiency of the light-emitting elements.

<Formation of Insulating Layer 131>

Figure 3A:
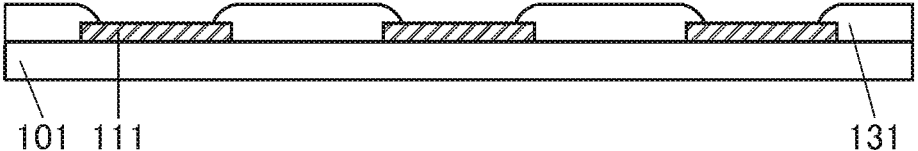
FIG. 3A to FIG. 3D are diagrams illustrating a manufacturing method of a display device.

Subsequently, the insulating layer 131 is formed to cover end portions of the pixel electrodes 111 (see FIG. 3A). An organic insulating film or an inorganic insulating film can be used for the insulating layer 131. The end portions of the insulating layer 131 are preferably tapered to improve step coverage with an EL film formed later. In particular, when the organic insulating film is used, a photosensitive material is preferably used so that the shape of the end portions can be easily controlled by the conditions of light exposure and development.

<Formation of EL Film 112Rf>

Figure 3B:
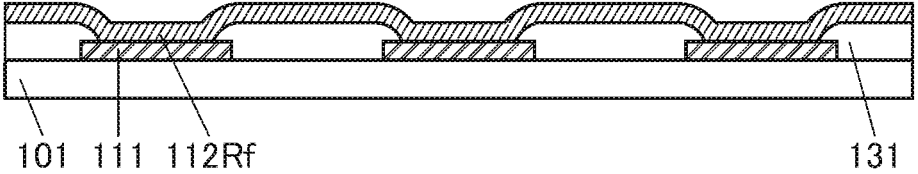

Next, an EL film 112Rf to be the EL layer 112R later is formed over the pixel electrodes 111 and the insulating layer 131 (see FIG. 3B).

The EL film 112Rf includes at least a film containing a red-light-emitting organic compound. A structure may be employed in which an electron-injection layer, an electron-transport layer, a charge-generation layer, a hole-transport layer, and a hole-injection layer are stacked in addition to the above. The EL film 112Rf can be formed by an evaporation method or a sputtering method, for example. Without limitation to this, the above-described deposition method can be used as appropriate.

<Formation of Resist Mask 143a>

Figure 3C:
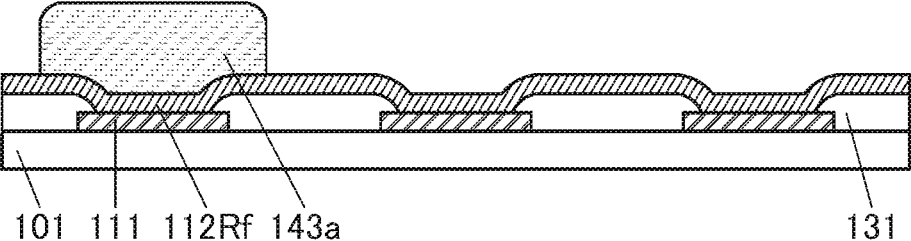

Subsequently, a resist mask 143a is formed over the pixel electrode 111 corresponding to the light-emitting device 110R (see FIG. 3C). The resist mask 143a can be formed by a lithography step.

<Formation of EL Layer 112R>

Figure 3D:
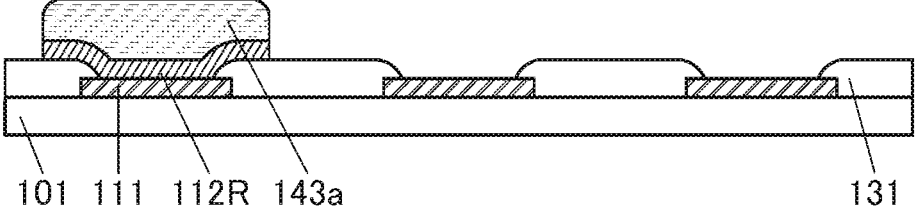

Next, the EL film 112Rf is etched with the resist mask 143a serving as a mask, so that the EL layer 112R is formed to have an island shape (see FIG. 3D). A dry etching method or a wet etching method can be used for the etching step.

<Formation of EL Film 112Gf>

Figure 4A:
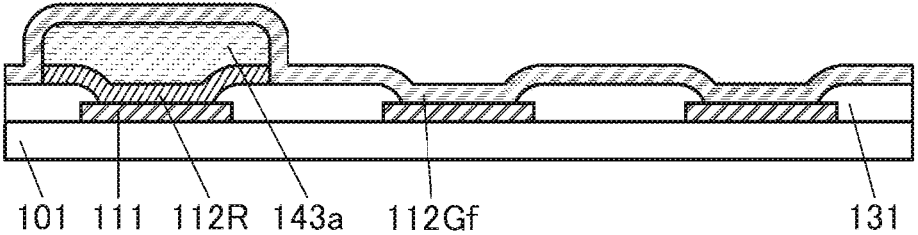
FIG. 4A to FIG. 4D are diagrams illustrating a manufacturing method of a display device.

Subsequently, an EL film 112Gf to be the EL layer 112G later is formed over the pixel electrodes 111 and the insulating layer 131 that are exposed and over the resist mask 143a (see FIG. 4A).

The EL layer 112Gf includes at least a film containing a green-light-emitting organic compound. A structure may be employed in which an electron-injection layer, an electron-transport layer, a charge-generation layer, a hole-transport layer, and a hole-injection layer are stacked in addition to the above.

<Formation of Resist Mask 143b>

Figure 4B:
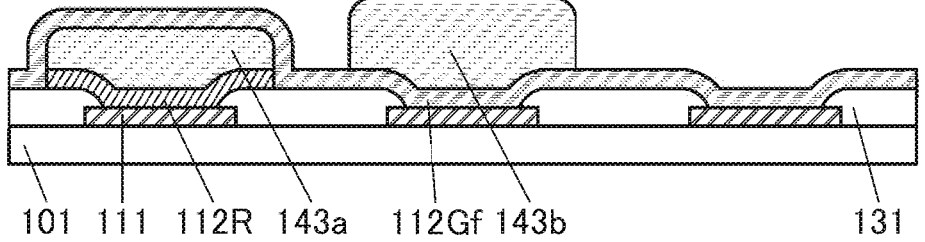

Next, a resist mask 143b is formed over the pixel electrode 111 corresponding to the light-emitting device 110G (see FIG. 4B). The resist mask 143b can be formed by a lithography step.

<Formation of EL Layer 112G>

Figure 4C:
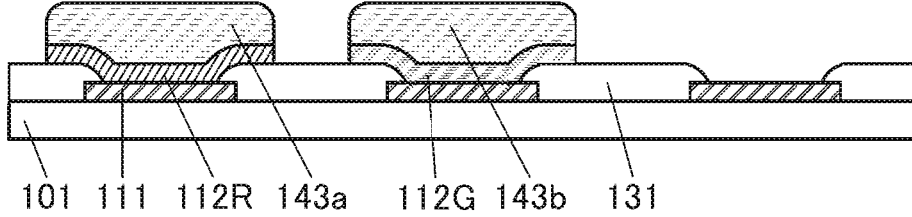

Subsequently, the EL film 112Gf is etched with the resist mask 143b serving as a mask, so that the EL layer 112G is formed to have an island shape (see FIG. 4C). A dry etching method or a wet etching method can be used for the etching step.

<Formation of EL Film 112Bf>

Figure 4D:
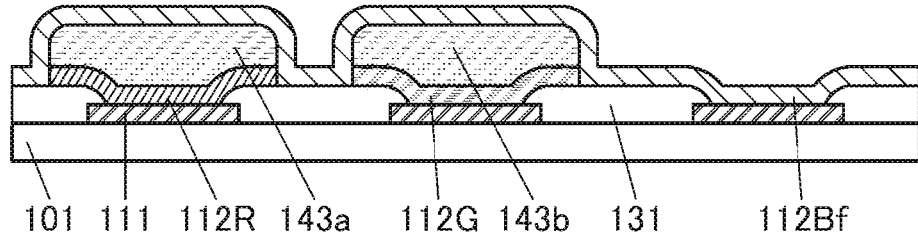

Next, an EL film 112Bf to be the EL layer 112B later is formed over the pixel electrode 111 and the insulating layer 131 that are exposed and over the resist mask 143a and the resist mask 143b (see FIG. 4D).

The EL film 112Bf includes at least a film containing a blue-light-emitting organic compound. A structure may be employed in which an electron-injection layer, an electron-transport layer, a charge-generation layer, a hole-transport layer, and a hole-injection layer are stacked in addition to the above.

<Formation of Resist Mask 143c>

Figure 5A:
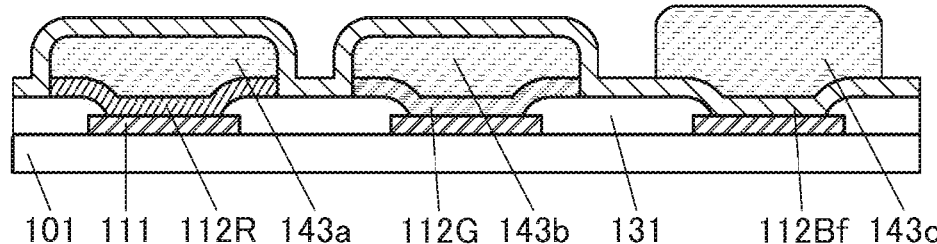
FIG. 5A to FIG. 5C are diagrams illustrating a manufacturing method of a display device.

Subsequently, a resist mask 143c is formed over the pixel electrode 111 corresponding to the light-receiving element 110B (see FIG. 5A). The resist mask 143c can be formed by a lithography step.

<Formation of EL Layer 112B>

Figure 5B:
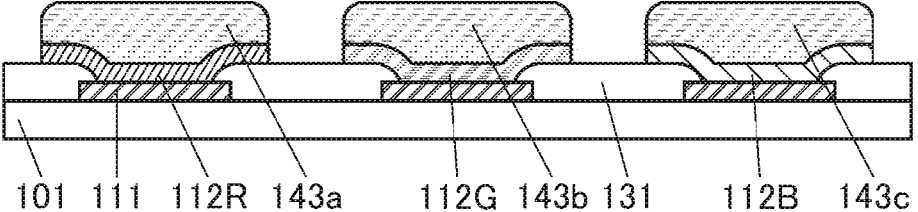

Next, the EL film 112Bf is etched with the resist mask 143c serving as a mask, so that the EL layer 112B is formed to have an island shape (see FIG. 5B). A dry etching method or a wet etching method can be used for the etching step.

<Removal of Resist Mask>

Figure 5C:
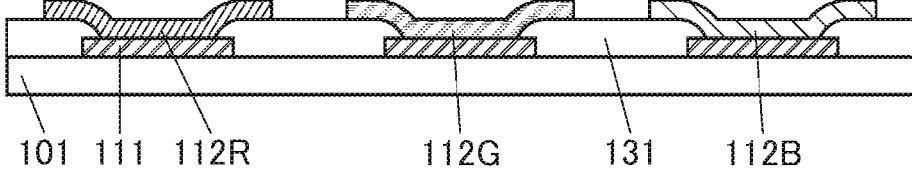

Subsequently, the resist mask 143a, the resist mask 143b, and the resist mask 143c are removed (see FIG. 5C). For the removal of the resist masks, a peeling method using an organic solvent can be used, for example. Alternatively, ashing using a dry etching apparatus may be employed.

<Formation of Resist Mask 150>

Figure 6A:
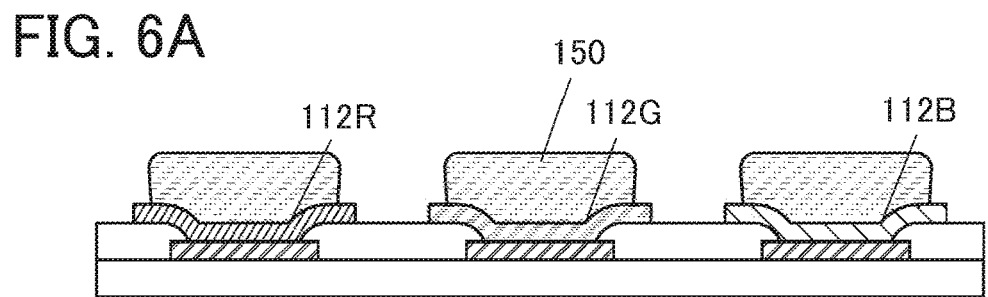
FIG. 6A and FIG. 6E are diagrams illustrating a manufacturing method of a display device.

Next, a resist mask 150 is formed over the EL layer 112R, the EL layer 112G, and the EL layer 112B (see FIG. 6A). The resist mask 150 can be formed by a lithography step. The resist mask 150 is formed such that a side surface of the resist mask is inversely tapered in a cross-sectional shape of a plane perpendicular to the top surface of the substrate 101. In the cross-sectional shape of the plane perpendicular to the substrate 101, the resist mask 150 can be formed such that an angle formed between the side surface of the resist mask 150 and the top surface of the substrate 101 becomes larger toward an end portion of the resist mask 150. A resist mask with such a shape is preferably formed with the use of a negative photoresist, for example.

<Formation of Auxiliary Wiring 115>

Figure 6B:
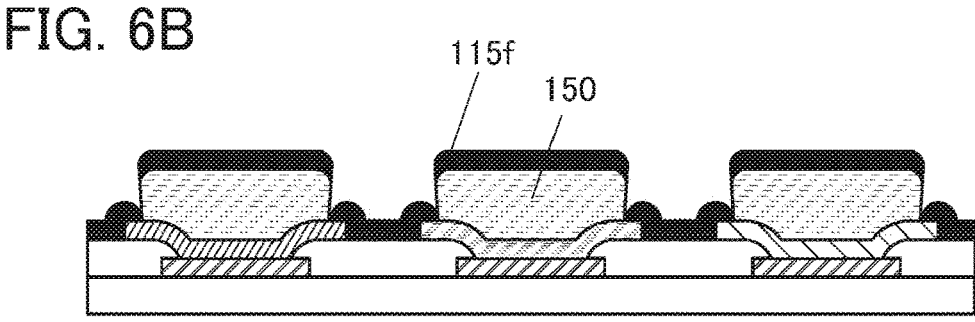

Subsequently, a conductive film 115*f* is formed. The conductive film 115*f* can be formed with a single layer or a stacked layer using a conductive material such as a material selected from aluminum (Al), titanium (Ti), tantalum (Ta), tungsten (W), molybdenum (Mo), chromium (Cr), neodymium (Nd), scandium (Sc), nickel (Ni), or copper (Cu) or an alloy material including any of these materials as its main component. For the step of forming the conductive film 115*f*, a sputtering method, an evaporation method, a coating method, or the like can be used. Here, since the side surface of the resist mask is inversely tapered, the conductive film 115*f* includes a region formed over the top surface of the resist mask 150 and a region formed between the resist masks 150, so that the conductive film 115*f* is separated at an end portion of the resist mask 150 (see FIG. 6B). Note that although FIG. 6B illustrates a structure in which the conductive film 115*f* is separated at the end portion of the resist mask 150, the conductive film 115*f* may be formed not to be separated and may be deposited to be continuous with a smaller thickness than that of the other regions.

<Removal of Resist Mask>

Figure 6C:
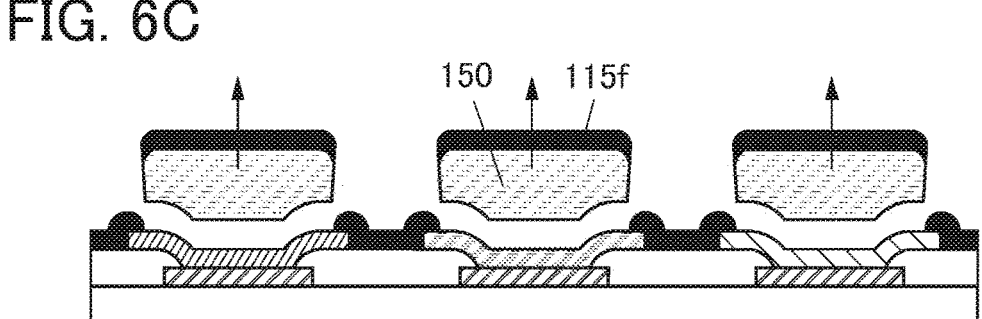

Next, the resist mask 150 is removed (see FIG. 6C). For the removal of the resist mask, a peeling method using an organic solvent can be used, for example. Alternatively, ashing using a dry etching apparatus or the like may be employed. In this manner, a step of forming a pattern through the removal of the resist mask is referred to as a lift-off method. Note that the auxiliary wiring 115 may be formed by processing the conductive film 115*f* without using the lift-off method.

In this manner, the auxiliary wiring 115 can be formed in a region, over the insulating layer 131 where the EL layer 112R, the EL layer 112G, and the EL layer 112B are not formed. In FIG. 6C, the auxiliary wiring 115 is placed over and in contact with the end portions of the EL layer 112R, the EL layer 112G, and the EL layer 112B.

<Formation of Common Electrode>

Figure 6D:
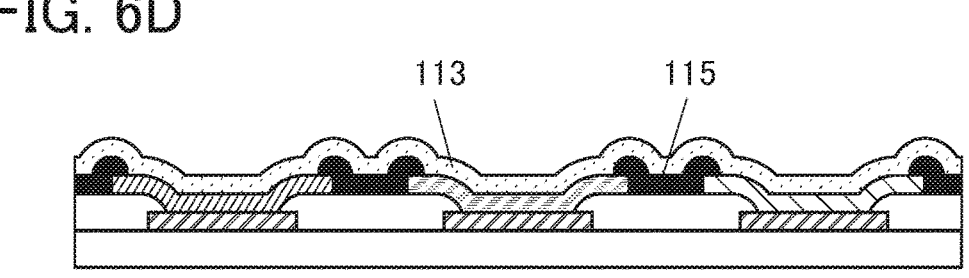

Subsequently, a conductive layer to be the common electrode 113 of the organic EL elements is formed over the EL layer 112R, the EL layer 112G, the EL layer 112B, and the auxiliary wiring 115 which are exposed in the previous step (see FIG. 6D). For the common electrode 113, either one of a thin metal film that semi-transmits light emitted from the light-emitting layers (e.g., an alloy of silver and magnesium) and a light-transmitting conductive film (e.g., indium tin oxide or an oxide containing one or more of indium, gallium, zinc, and the like) or a stack of these films can be used. The common electrode 113 formed using such a film can be referred to as an electrode having light-transmitting property. For the step of forming the conductive layer to be the common electrode 113, an evaporation apparatus and/or a sputtering apparatus can be used, for example.

When the electrode having a light-reflecting property is included as the pixel electrode 111 and the electrode having light-transmitting property is included as the common electrode 113, light emitted from the light-emitting layer can be emitted to the outside through the common electrode 113. In other words, top-emission light-emitting elements are formed.

<Formation of Protective Layer>

Figure 6E:
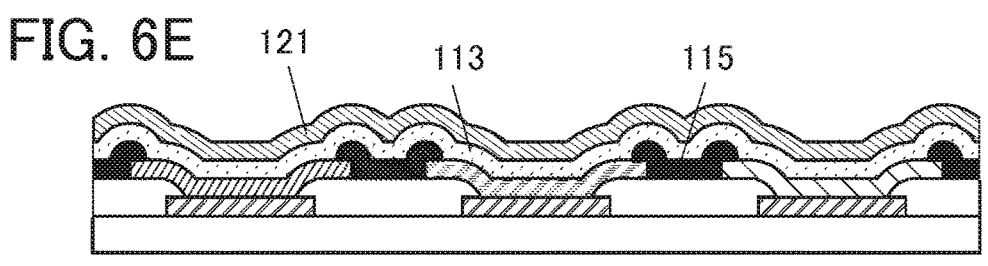

Next, the protective layer 121 is formed over the common electrode 113 (see FIG. 6E). For the step of forming the protective layer, a sputtering apparatus, a CVD apparatus, an ALD apparatus, or the like can be used.

In this manner, the display device 100 can be manufactured.

Structure Example 2

FIG. 7A illustrates another structure example of the display device 100 of this embodiment. Although FIG. 6E illustrates a structure in which the auxiliary wiring 115 includes a region placed over and in contact with the end portions of the EL layer 112R, the EL layer 112G, and the EL layer 112B, as illustrated in FIG. 7A, a structure in which the auxiliary wiring 115 is not in contact with the EL layer 112R, the EL layer 112G, and the EL layer 112B can be employed.

Structure Example 3

FIG. 7B to FIG. 7D illustrate other structure examples of the display device 100 of this embodiment. Although FIG. 6E and FIG. 7A illustrate a structure in which the common electrode 113 is placed over the auxiliary wiring 115, a structure in which the auxiliary wiring 115 is placed over the common electrode 113 may be employed.

For example, as illustrated in FIG. 7B, a common electrode 113R, a common electrode 113G, and a common electrode 113B are formed over the EL layer 112R, the EL layer 112G, and the EL layer 112B, respectively. Note that the common electrode 113R, the common electrode 113G, and the common electrode 113B may be separated on the color (corresponding to a light-emitting element) basis; may be separated on the light-emitting element basis; or may be continuous between the plurality of the light-emitting elements. Next, as illustrated in FIG. 7C, the auxiliary wiring 115 is formed so as to be in contact with the common electrode 113R, the common electrode 113G, and the common electrode 113B. As a formation method of the auxiliary wiring 115, a lithography step can be used. Then, as illustrated in FIG. 7D, the protective layer 121 is formed over the common electrode 113R, the common electrode 113G, the common electrode 113B, and the auxiliary wiring 115. In this manner, the display device 100 in which the auxiliary wiring 115 is placed over the common electrode 113 can also be obtained.

In the above-described manner, since the EL layer is processed after being formed over the entire surface without utilizing a film deposition method using a metal mask in the manufacturing method example of the display device, the island-shaped EL layer can be formed with a uniform thickness.

EL layers 113*a*, 113*b*, and 113*c* forming the light-emitting elements of different colors are formed by different processes from each other. Accordingly, the respective EL layers can be formed to have structures (a material, thickness, and the like) appropriate for the light-emitting elements of different colors. Thus, the light-emitting elements can have favorable characteristics.

Since the display device of this embodiment is manufactured by a method in which formation of EL layers using a metal mask is not performed, an increase in size, definition, or resolution of the display device can be achieved.

This embodiment can be combined with the other embodiments as appropriate. In the case where a plurality of structure examples are described in one embodiment in this specification, the structure examples can be combined as appropriate.

Embodiment 2

In this embodiment, a structure of a display device which is different from that described in Embodiment 1 and a manufacturing method thereof will be described with reference to drawings.

Structure Example 4

Figure 8:
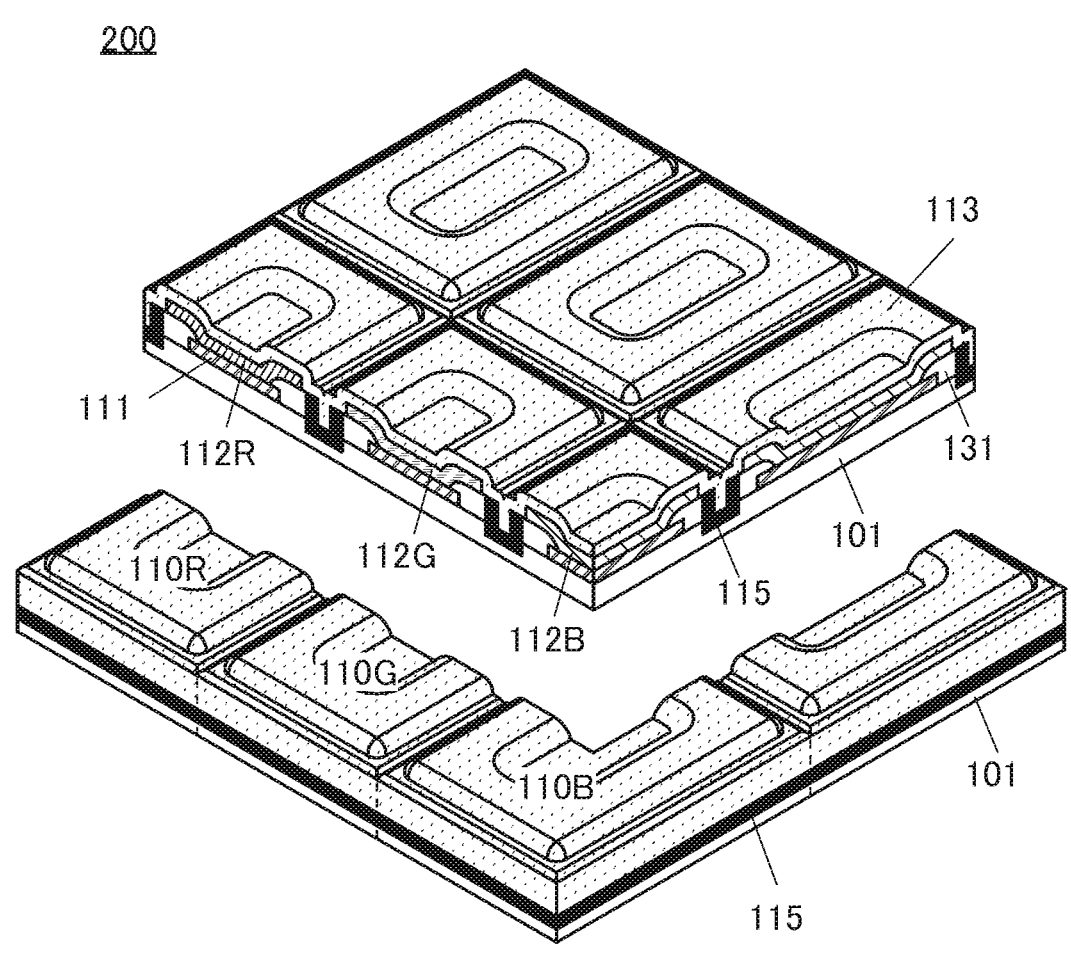
FIG. 8 is a perspective cross-sectional view illustrating a display device.

FIG. 8 illustrates a perspective cross-sectional view of a display device 200 of one embodiment of the present invention. In addition, FIG. 9A illustrates a schematic top view of the display device 200 of one embodiment of the present invention. The display device 200 includes a plurality of light-emitting elements 110R exhibiting red, a plurality of light-emitting elements 110G exhibiting green, and a plurality of light-emitting elements 110B exhibiting blue. In FIG. 9A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 9A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

Figure 9B:
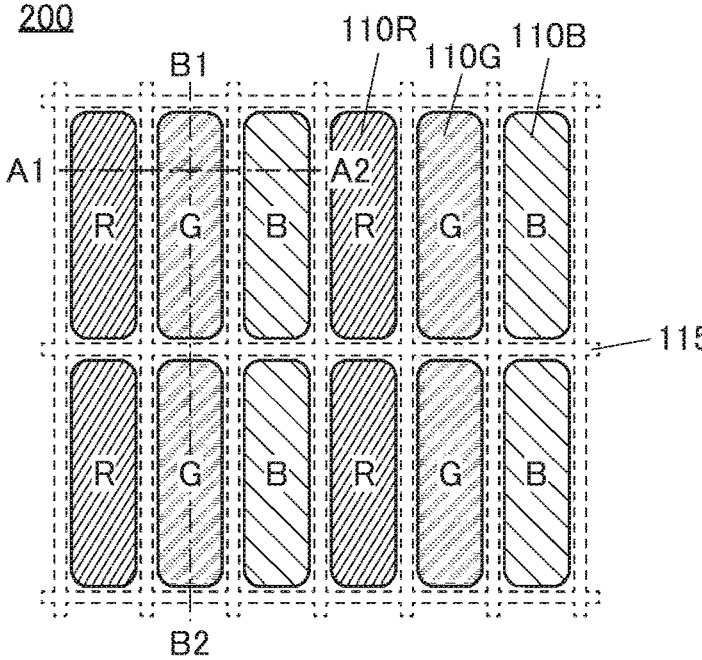
Figure 9C:
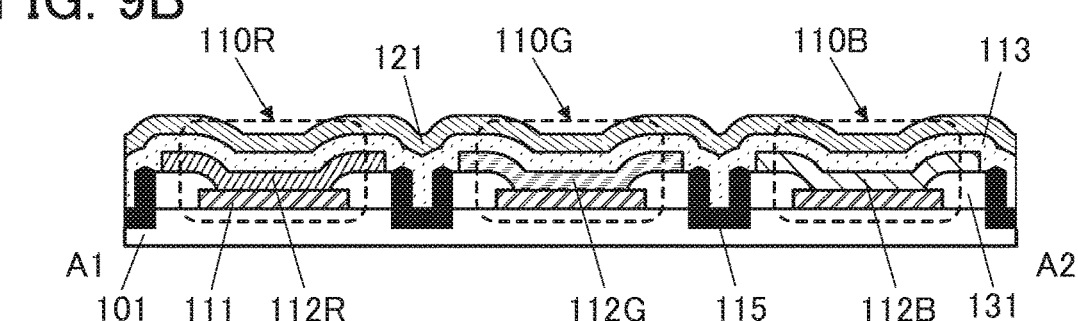

FIG. 8 illustrates a cross section of the light-emitting element 110R, the light-emitting element 110G, and the light-emitting element 110B. FIG. 9B is a cross-sectional schematic view taken along the dashed-dotted line A1-A2 in FIG. 9A, and FIG. 9C is a cross-sectional schematic view taken along the dashed-dotted line B1-B2.

As illustrated in FIG. 8 and FIG. 9B, each of the light-emitting element 110R, the light-emitting element 110G, and the light-emitting element 110B is provided over a substrate 101 and includes a pixel electrode 111 which functions as an anode, and a common electrode 113 which functions as a cathode. In addition, an auxiliary wiring 115 electrically connected to the common electrode 113 is provided. The auxiliary wiring 115 has a net-like shape (can also be referred to as a lattice shape or a matrix shape) in a top view of a display region in FIG. 8 and FIG. 9A.

The light-emitting element 110R includes an EL layer 112R between the pixel electrode 111 and the common electrode 113. The EL layer 112R contains at least a light-emitting organic compound that emits light with a peak in a red wavelength range. An EL layer 112G included in the light-emitting element 110G contains at least a light-emitting organic compound that emits light with a peak in a green wavelength range. An EL layer 112B included in the light-emitting element 110B contains at least a light-emitting organic compound that emits light with a peak in a blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer).

The pixel electrode 111 is provided for each of the light-emitting elements. The common electrode 113 is provided as a common layer to the light-emitting elements. In this embodiment, an example of manufacturing a top-emission display device is described.

An insulating layer 131 is provided to cover an end portion of the pixel electrode 111 so as to insulate the adjacent pixel electrodes 111. The end portion of the insulating layer 131 is preferably tapered.

In this embodiment, the insulating layer 131 includes an opening portion, and a part of the substrate 101 is etched in a region overlapping with the opening portion, so that a groove portion is provided. Note that, in the case where a conductive layer or an insulating layer is formed between the substrate 101 and the insulating layer 131, the groove portion is formed in the conductive layer or the insulating layer. The auxiliary wiring 115 is provided so as to be in contact with an inner wall of the opening portion of the insulating layer 131 and the groove portion (or the groove portion of a layer formed between the substrate 101 and the insulating layer 131) of the substrate 101. At least the top surface of the auxiliary wiring 115 is in contact with the common electrode 113. The auxiliary wiring 115 is formed using a conductive material and is electrically connected to a cathode extraction terminal (not illustrated) on the outside of the display region.

Note that FIG. 9B illustrates, as an example, the case where the width of the opening portion of the insulating layer 131 is substantially the same as the width of the groove portion of the substrate 101 in the cross-sectional shape; however, an embodiment of this present invention is not limited thereto. For example, the width of the opening portion of the insulating layer 131 may be larger than the width of the groove portion of the substrate 101 (or the groove portion of the layer provided between the substrate 101 and the insulating layer 131). With such a shape, the coverage of the auxiliary wiring 115 provided in an inner portion of the groove portion and the opening portion can be improved.

the EL layer 112R, the EL layer 112G, and the EL layer 112B each include a region in contact with the top surface of the pixel electrode 111 and a region in contact with a surface of the insulating layer 131. The end portions of the EL layer 112R, the EL layer 112G, and the EL layer 112B are positioned over the insulating layer 131.

As illustrated in FIG. 9B, there is a gap between the two EL layers of the light-emitting elements with different colors. In this manner, the EL layer 112R, the EL layer 112G, and the EL layer 112G are preferably provided so as not to be in contact with each other. This suitably prevents unintentional light emission from being caused by current flowing through two adjacent EL layers. As a result, the contrast can be increased to achieve a display device with high display quality.

Figure 9D:
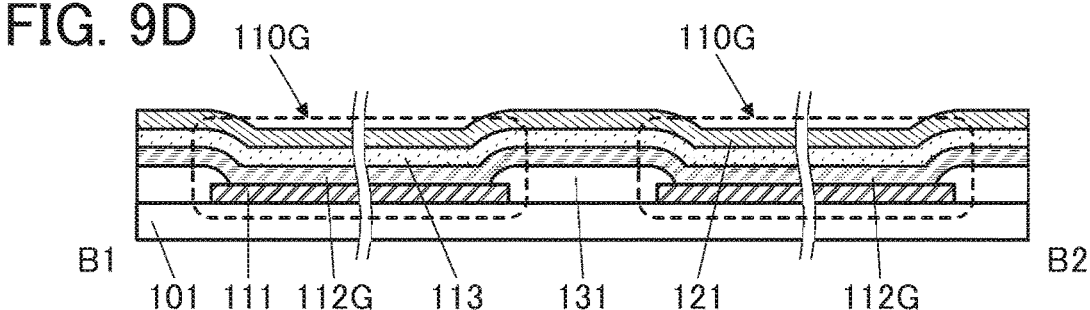

FIG. 9C illustrates an example in which the EL layer 112G is processed into an island shape. Note that, as illustrated in FIG. 9D, the EL layer 112G may be processed into a belt-like shape so as to be continuous in a column direction. When the EL layer 112G and the like are formed in a belt-like shape, no space required for dividing the layer is needed and thus a non-light-emitting area between the light-emitting elements can be reduced, resulting in an increased aperture ratio.

As illustrated in FIG. 9D, the auxiliary wiring 115 can be formed between pixels exhibiting different colors instead of providing the auxiliary wiring 115 between adjacent pixels exhibiting the same color. In this case, the auxiliary wiring 115 can have a stripe shape in a top view. When the auxiliary wiring 115 has a stripe shape, a space required for forming the auxiliary wiring 115 is not needed, different from the case where the auxiliary wiring 115 has a lattice shape, resulting in an increased aperture ratio. Furthermore, cross-talk between pixels exhibiting the same color can be reduced.

FIG. 9C and FIG. 9D shows the cross section of the light-emitting element 110G as an example; the light-emitting element 110R and the light-emitting element 110B can have a similar shape.

In addition, a protective layer 121 is provided over the common electrode 113 so as to cover the light-emitting element 110R, the light-emitting element 110G, and the light-emitting element 110B. The protective layer 121 has a function of preventing diffusion of impurities into the light-emitting elements from above.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

<Manufacturing Method Example>

Hereinafter, an example of a manufacturing method of the display device of one embodiment of the present invention will be described with reference to drawings. Description is made here using the display device 200 described in the above structure example. FIG. 10A to FIG. 10F are cross-sectional schematic views of steps in the manufacturing method of the display device described as an example below.

First, the pixel electrode 111, the insulating layer 131, the EL layer 112R, the EL layer 112G, and the EL layer 112B are formed over the substrate 101 by a manufacturing method similar to that illustrated in FIG. 3A to FIG. 5C in Embodiment 1.

<Formation of Resist Mask 150>

Figures 10A, 10B, 10C, 10D, 10E, 10F:
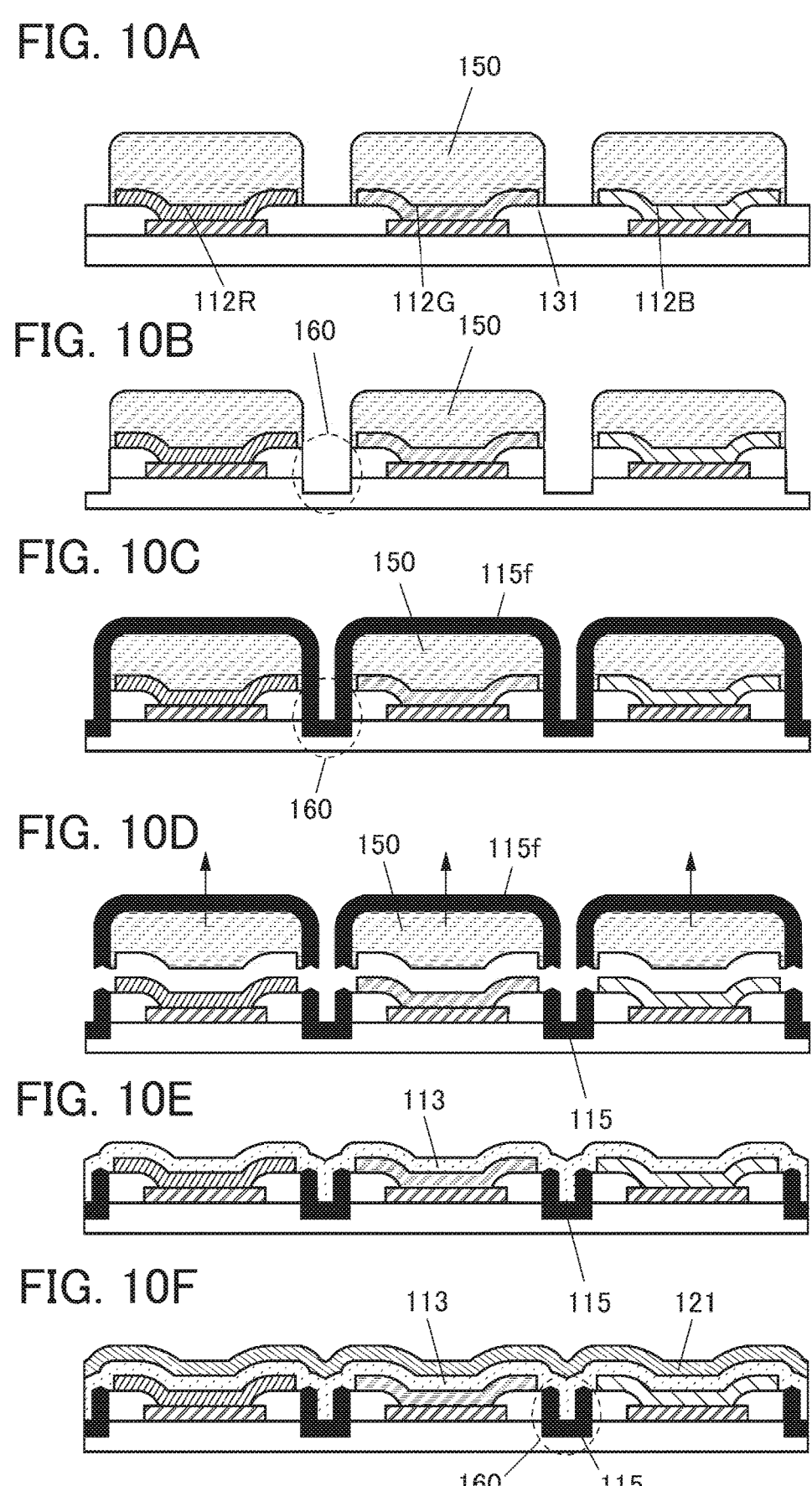
FIG. 10A to FIG. 10F are diagrams illustrating a manufacturing method of a display device.

The resist mask 150 is formed over the EL layer 112R, the EL layer 112G, and the EL layer 112B such that part of the insulating layer 131 is exposed (see FIG. 10A). The resist mask 150 can be formed by a lithography step.

<Formation of Opening Portion 160>

Next, the insulating layer 131 is etched with the resist mask 150 serving as a mask, so that the opening portion 160 is formed (see FIG. 10 B). A dry etching method or a wet etching method can be used for the etching step. The opening portion 160 is formed to have a net-like shape or a stripe shape in a top view so as to divide pixels in the vertical direction and/or in the lateral direction.

FIG. 10B illustrates the case, for example, where part of the substrate 101 is etched in the etching step of the insulating layer 131 to form a groove portion in the substrate 101. Note that, although not illustrated, in the case where an insulating layer or a conductive layer is provided between the substrate 101 and the insulating layer 131, a groove portion is formed in the insulating layer or the conductive layer instead of the substrate 101 or in addition to the substrate 101.

<Formation of Conductive Film 115f>

Subsequently, a conductive film 115f to be the auxiliary wiring 115 later is formed over the resist mask 150 and in the opening portion 160 (see FIG. 10C). The conductive film 115f can be formed using a conductive material, for example, with a single layer or a stacked layer using a material selected from aluminum (Al), titanium (Ti), tantalum (Ta), tungsten (W), molybdenum (Mo), chromium (Cr), neodymium (Nd), scandium (Sc), nickel (Ni), or copper (Cu) or an alloy material including any of these materials as its main component. For the step of forming the conductive film 115f, a sputtering method, an evaporation method, a coating method, or the like can be used.

<Formation of Auxiliary Wiring 115>

Next, the resist mask 150 and a region of the conductive film 115f in contact with the resist mask 150 are removed by the lift-off method or the like (see FIG. 10D). In this manner, the auxiliary wiring 115 can be formed in a region in contact with the inner wall of the opening portion 160 of the insulating layer 131 and the groove portion of the substrate 101. Note that the auxiliary wiring 115 may be formed by processing the conductive film 115f without using the lift-off method.

<Formation of Common Electrode>

Subsequently, a conductive layer to be the common electrode 113 of the organic EL elements is formed over the EL layer 112R, the EL layer 112G, the EL layer 112B, and the auxiliary wiring 115, which are exposed in the previous step, and the insulating layer 131. For the common electrode 113, either one of a thin metal film that semi-transmits light emitted from the light-emitting layers (e.g., an alloy of silver and magnesium) and a light-transmitting conductive film (e.g., indium tin oxide or an oxide containing one or more of indium, gallium, zinc, and the like) or a stack of these films can be used. The common electrode 113 formed using such a film can be referred to as an electrode having light-transmitting property. For the step of forming the conductive layer to be the common electrode 113, an evaporation apparatus and/or a sputtering apparatus can be used, for example.

When the electrode having a light-reflecting property is included as the pixel electrode 111 and the electrode having light-transmitting property is included as the common electrode 113, light emitted from the light-emitting layers can be emitted to the outside through the common electrode 113. In other words, top emission light-emitting elements are formed (see FIG. 10E).

<Formation of Protective Layer>

Next, the protective layer 121 is formed over the common electrode 113 (see FIG. 10F). For the step of forming the protective layer, a sputtering apparatus, a CVD apparatus, an ALD apparatus, or the like can be used.

Through the above-described steps, a display device 200 can be manufactured.

Structure Example 5

Figures 11A, 11B, 11C, 11D:
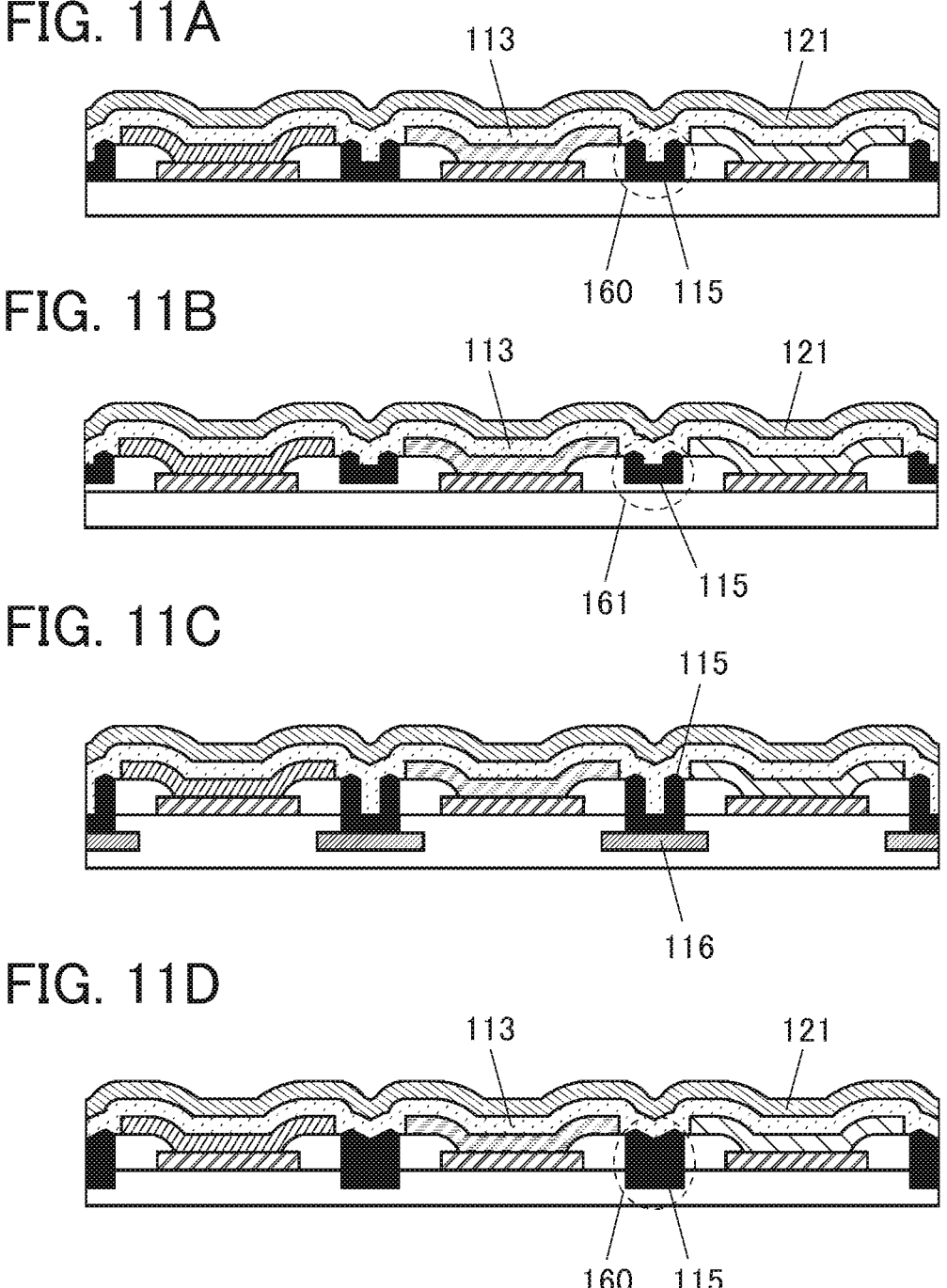
FIG. 11A to FIG. 11D are diagrams illustrating a display device.

FIG. 11A illustrates another structure example of the display device 200 of this embodiment. FIG. 11A illustrates a structure in which the substrate 101 (or a layer formed over the substrate 101) is not etched at the time of etching for forming the opening portion 160, and the auxiliary wiring 115 is in contact with the top surface of the substrate 101 (or the layer formed over the substrate 101). By contrast, as in FIG. 9B and the like, when the bottom surface of the opening portion 160 reaches an inner portion of the substrate 101 (or the layer formed over the substrate 101), the area of the region where the auxiliary wiring 115 is formed can be increased, so that the contact resistance between the auxiliary wiring 115 and the common electrode 113 can be further reduced.

Structure Example 6

FIG. 11B illustrates another structure example of the display device 200 of this embodiment. FIG. 11B illustrates a structure in which a groove portion 161 is provided in the insulating layer 131 instead of the opening portion and the auxiliary wiring 115 is provided to be in contact with an inner wall of the groove portion 161. With the structure in FIG. 11B, cycle time for the etching step of the insulating layer 131 can be further shortened.

Structure Example 7

FIG. 11C illustrates another structure example of the display device 200 of this embodiment. FIG. 11C illustrates a structure in which a first layer 116 is formed in a region below the insulating layer 131 and the auxiliary wiring 115 is in contact with the top surface of the first layer 116 in the opening portion 160. In FIG. 11C, the first layer 116 functions as an etching stopper at the time of forming the opening portion 160.

As a material for the first layer 116, a conductive material or an insulating material may be used. In the case where the first layer 116 is formed using an insulating material, the first layer 116 may be provided so as not to be separated on the pixel basis. In the case where the first layer 116 is formed using a conductive material, the first layer 116 may be formed through the same step as a gate electrode of a transistor formed on the substrate 101 or the same step as a source electrode and a drain electrode of the transistor. Furthermore, in the case where the first layer 116 is formed using a conductive material, the auxiliary wiring 115 and the common electrode 113 can be electrically connected to the cathode extraction terminal through the first layer 116.

Note that, as illustrated in FIG. 11C, another insulating layer or conductive layer may be formed between the first layer 116 functioning as an etching stopper and the insulating layer 131. In this case, an opening portion are formed in a region overlapping with the opening portion 160 also in the insulating layer or the conductive layer. Note that the first layer 116 may be provided so that the top surface of the first layer 116 is in contact with the insulating layer 131.

Structure Example 8

FIG. 11D illustrates another structure example of the display device 200 of this embodiment. FIG. 11D illustrates a structure in which the auxiliary wiring 115 is provided so that the auxiliary wiring 115 fills the opening portion 160 of the insulating layer 131 and the grove portion overlapping with the opening portion 160. As the structure illustrated in FIG. 11D, when the auxiliary wiring 115 fills the opening portion 160 and the groove portion overlapping with the opening portion 160, the cross-sectional area of the auxiliary wiring 115 can be increased, whereby wiring resistance can be reduced.

In the above-described manner, since the EL layer is processed after being formed over the entire surface without utilizing a film deposition method using a metal mask in the manufacturing method example of the display device, the island-shaped EL layer can be formed with a uniform thickness.

EL layers 113a, 113b, and 113c forming the light-emitting elements of different colors are formed by different processes from each other. Accordingly, the respective EL layers can be formed to have structures (a material, thickness, and the like) appropriate for the light-emitting elements of different colors. Thus, the light-emitting elements can have favorable characteristics.

Since the display device of this embodiment is manufactured by a method in which formation of EL layers using a metal mask is not performed, an increase in size, definition, or resolution of the display device can be achieved.

In the display device of this embodiment, the EL layer is formed by a photolithography method, so that the insulating layer 131 functioning as a partition wall includes a region exposed between pixels. When the auxiliary wiring is provided to overlap with the region, space saving of a formation region of the auxiliary wiring can be achieved. In addition, when the opening portion or the groove portion is provided in the insulating layer 131, the area of the auxiliary wiring can be increased. Laying out the auxiliary wiring efficiently in this manner enables both increased resolution of pixels and reduced resistance of the common electrode.

The display device of this embodiment is provided in an embodiment in which the top surface of the auxiliary wiring 115 is directly in contact with the common electrode 113; thus, contact resistance with the cathode can be effectively reduced.

With the use of the structure of the display device of one embodiment of the present invention and the manufacturing method thereof which are described above, a display device which incorporates a downsized organic EL element with high luminance and high reliability can be obtained.

This embodiment can be implemented in an appropriate combination with the structures described in the other embodiments. In the case where a plurality of structure examples are described in one embodiment in this specification, the structure examples can be combined as appropriate.

Embodiment 3

Figures 12A, 12B:
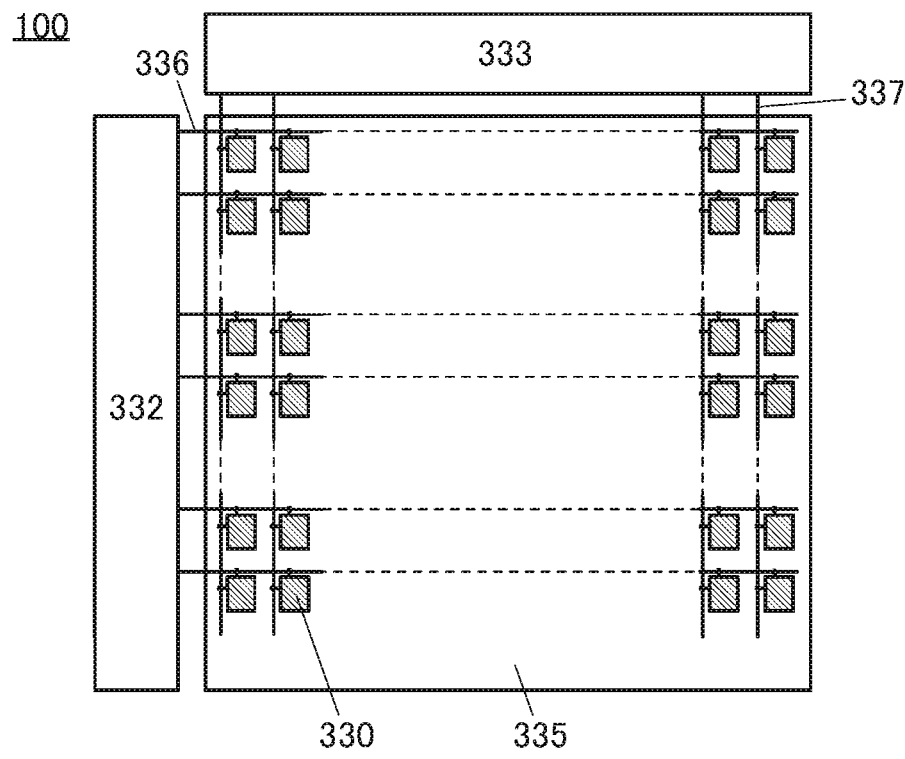
FIG. 12A is a diagram showing a structure example of a display device.
FIG. 12B is a diagram showing a structure example of a pixel circuit.

In this embodiment, a more specific structure example of the display device of one embodiment of the present invention will be described. FIG. 12A is a block diagram showing the display device 100. The display device 100 includes a display region 335 (can also be referred to as a pixel portion or a display portion), a peripheral circuit region 332, and a peripheral circuit region 333.

A circuit included in the peripheral circuit region 332 functions as, for example, a scan line driver circuit. A circuit included in the peripheral circuit region 333 functions as, for example, a signal line driver circuit. Note that some sort of circuit may be provided to face the peripheral circuit region 332 with the display region 335 positioned therebetween. Some sort of circuit may be provided to face the peripheral circuit region 333 with the display region 335 positioned therebetween. Note that, as described above, the circuits included in the peripheral circuit region 332 and the peripheral circuit region 333 are collectively referred to as a "peripheral driver circuit" in some cases.

Various circuits such as a shift register, a level shifter, an inverter, a latch, an analog switch, and a logic circuit can be used as the peripheral driver circuit. In the peripheral driver circuit, a transistor, a capacitor, and the like can be used. A transistor included in the peripheral driver circuit can be formed in the same steps as a transistor included in a pixel 330.

The display device 100 includes m wirings 336 which are arranged substantially parallel to each other and whose potentials are controlled by the circuit included in the peripheral circuit region 332, and n wirings 337 which are arranged substantially parallel to each other and whose potentials are controlled by the circuit included in the peripheral circuit region 333.

Furthermore, the display region 335 includes a plurality of pixels 330 arranged in a matrix. Full-color display can be achieved by making the pixel 330 that controls red light, the pixel 330 that controls green light, and the pixel 330 that controls blue light collectively function as one pixel and by controlling the amount of light (emission luminance) emitted from each pixel 330. Thus, the three pixels 330 each function as a sub-pixel. Three sub-pixels control the amount or the like of red light, green light, and blue light. Note that the light colors controlled by the three sub-pixels are not limited to a combination of red (R), green (G), and blue (B) and may be cyan (C), magenta (M), and yellow (Y).

Furthermore, four sub-pixels may collectively function as one pixel. For example, a sub-pixel that controls white light may be added to the three sub-pixels that control red light, green light, and blue light. The addition of the sub-pixel that controls white light can increase the luminance of a display region. Alternatively, a sub-pixel that controls yellow light may be added to the three sub-pixels that control red light, green light, and blue light. Alternatively, a sub-pixel that controls white light may be added to the three sub-pixels that control cyan light, magenta light, and yellow light.

When the number of sub-pixels functioning as one pixel is increased and sub-pixels that control light of red, green, blue, cyan, magenta, yellow, and the like are used in an appropriate combination, the reproducibility of halftones can be increased. Thus, display quality can be increased.

The display device according to one embodiment of the present invention can reproduce the color gamut of various standards. For example, the display device according to one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display devices used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to as Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

In addition, by arranging the pixels in a matrix of 1920×1080, the display device 100 that can perform full-color display with a resolution of what is called full high definition (also referred to as "2K resolution," "2K1K," "2K," or the like) can be achieved. Alternatively, for example, by arranging the pixels in a matrix of 3840×2160, the display device 100 that can perform full-color display with a resolution of what is called ultra high definition (also referred to as "4K resolution," "4K2K," "4K," or the like) can be achieved. Alternatively, for example, by arranging the pixels in a matrix of 7680×4320, the display device 100 that can perform full-color display with a resolution of what is called super high definition (also referred to as "8K resolution," "8K4K," "8K," or the like) can be achieved. By increasing the number of pixels, the display device 100 can achieve full color display with 16K or 32K resolution.

<Circuit Structure Example of Pixel 330>

FIG. 12B is a diagram showing a circuit structure example of the pixel 330. The pixel 330 includes a pixel circuit 431 and a display element 432.

Each of the wirings 336 is electrically connected to the n pixel circuits 431 in a given row among the pixel circuits 431 arranged in m rows and n columns in the display region 335. Each wiring 337 is electrically connected to the m pixel circuits 431 arranged in a given column among the pixel circuits 431 arranged in m rows and n columns. Note that m and n are each an integer of 1 or more.

The pixel circuit 431 includes a transistor 436, a capacitor 433, a transistor 351, and a transistor 434. The pixel circuit 431 is electrically connected to a light-emitting element 370 that functions as the display element 432.

One of a source electrode and a drain electrode of the transistor 436 is electrically connected to a wiring to which a data signal (also referred to as a "video signal") is supplied (hereinafter referred to as a signal line DL_n). A gate electrode of the transistor 436 is electrically connected to a wiring to which a gate signal is supplied (hereinafter referred to as a scan line GL_m). The signal line DL_n and the scan line GL_m correspond to the wiring 337 and the wiring 336, respectively.

The transistor 436 has a function of controlling the writing of the data signal to a node 435.

One of a pair of electrodes of the capacitor 433 is electrically connected to the node 435, and the other is electrically connected to the node 437. The other of the source electrode and the drain electrode of the transistor 436 is electrically connected to the node 435.

The capacitor 433 has a function of a storage capacitor for storing data written to the node 435.

One of a source electrode and a drain electrode of the transistor 351 is electrically connected to a potential supply line VL_a, and the other is electrically connected to the node 437. Furthermore, a gate electrode of the transistor 351 is electrically connected to the node 435.

One of a source electrode and a drain electrode of the transistor 434 is electrically connected to a potential supply line VO, and the other is electrically connected to the node 437. Furthermore, a gate electrode of the transistor 434 is electrically connected to the scan line GL_m.

One of an anode and a cathode of the light-emitting element 370 is electrically connected to a potential supply line VL_b, and the other is electrically connected to the node 437.

As the light-emitting element 370, an organic electroluminescent element (also referred to as an organic EL element) or the like can be used, for example. Note that the light-emitting element 370 is not limited thereto; an inorganic EL element formed of an inorganic material may be used, for example.

As a power supply potential, a potential on the relatively high potential side or a potential on the relatively low potential side can be used, for example. A power supply potential on the high potential side is referred to as a high power supply potential (also referred to as "VDD"), and a power supply potential on the low potential side is referred to as a low power supply potential (also referred to as "VSS"). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuits 431, the pixel circuits 431 are sequentially selected row by row by the circuit included in the peripheral circuit region 332, whereby the transistors 436 and the transistors 434 are turned on and a data signal is written to the nodes 435.

The pixel circuit 431 in which data has been written to the node 435 is brought into a retention state when the transistor 436 and the transistor 434 are brought into an off state. Furthermore, the amount of current flowing between the source electrode and the drain electrode of the transistor 351 is controlled in accordance with the potential of the data written to the node 435, and the light-emitting element 370 emits light with a luminance corresponding to the amount of current flow. This operation is sequentially performed row by row; thus, an image can be displayed.

<Structure Example of Display Device>

Figures 13A, 13B, 13C:
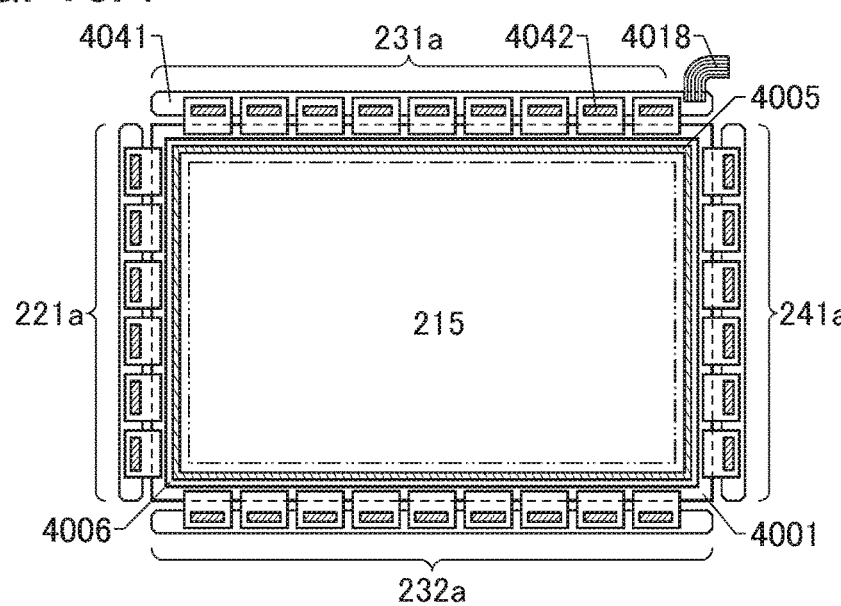
FIG. 13A to FIG. 13C are diagrams illustrating a display device.

FIG. 13A to FIG. 13C are diagrams each illustrating a structure of a display device in which one embodiment of the present invention can be used.

In FIG. 13A, a sealant 4005 is provided to surround a display portion 215 provided over a first substrate 4001, and the display portion 215 is sealed with the sealant 4005 and a second substrate 4006.

In FIG. 13A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF (Chip On Film) method, a COG (Chip On Glass) method, a TCP (Tape Carrier Package) method, or the like can be used.

FIG. 13B illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 13B, the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 13B, the sealant 4005 is provided to surround the display portion 215, the scan line driver circuit 221a, and the common line driver circuit 241a that are provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with light-emitting elements by the first substrate 4001, the sealant 4005, and the second substrate 4006.

Although the signal line driver circuit 231a and the signal line driver circuit 232a are separately formed and mounted on the first substrate 4001 in the example illustrated in FIG. 13B, one embodiment of the present invention is not limited to this structure. The scan line driver circuit may be separately formed and then mounted, or part of the signal line driver circuit or part of the scan line driver circuit may be separately formed and then mounted. The signal line driver circuit 231a and the signal line driver circuit 232a may be formed over the same substrate as the display portion 215, as illustrated in FIG. 13C.

In some cases, the display device includes a panel in which a light-emitting element is sealed, and a module in which an IC or the like including a controller is mounted on the panel.

The display portion and the scan line driver circuit provided over the first substrate each include a plurality of transistors.

Transistors included in peripheral driver circuits and transistors included in the pixel circuits of the display portion may have either the same structure or different structures. The transistors included in the peripheral driver circuits may be transistors having the same structure, or transistors having two or more kinds of structures may be included. Similarly, the transistors included in the pixel circuits may be transistors having the same structure, or transistors having two or more kinds of structures may be included.

An input device can be provided over the second substrate 4006. The display devices illustrated in FIG. 13A to FIG. 13C and provided with the input device can function as a touch panel.

There is no limitation on a sensor device (also referred to as a sensor element) included in a touch panel of one embodiment of the present invention. A variety of sensors capable of sensing an approach or a contact of a sensing target such as a finger or a stylus can be used as the sensor device.

For example, a variety of types such as a capacitive type, a resistive type, a surface acoustic wave type, an infrared type, an optical type, and a pressure-sensitive type can be used as the sensor type.

Figure 14:
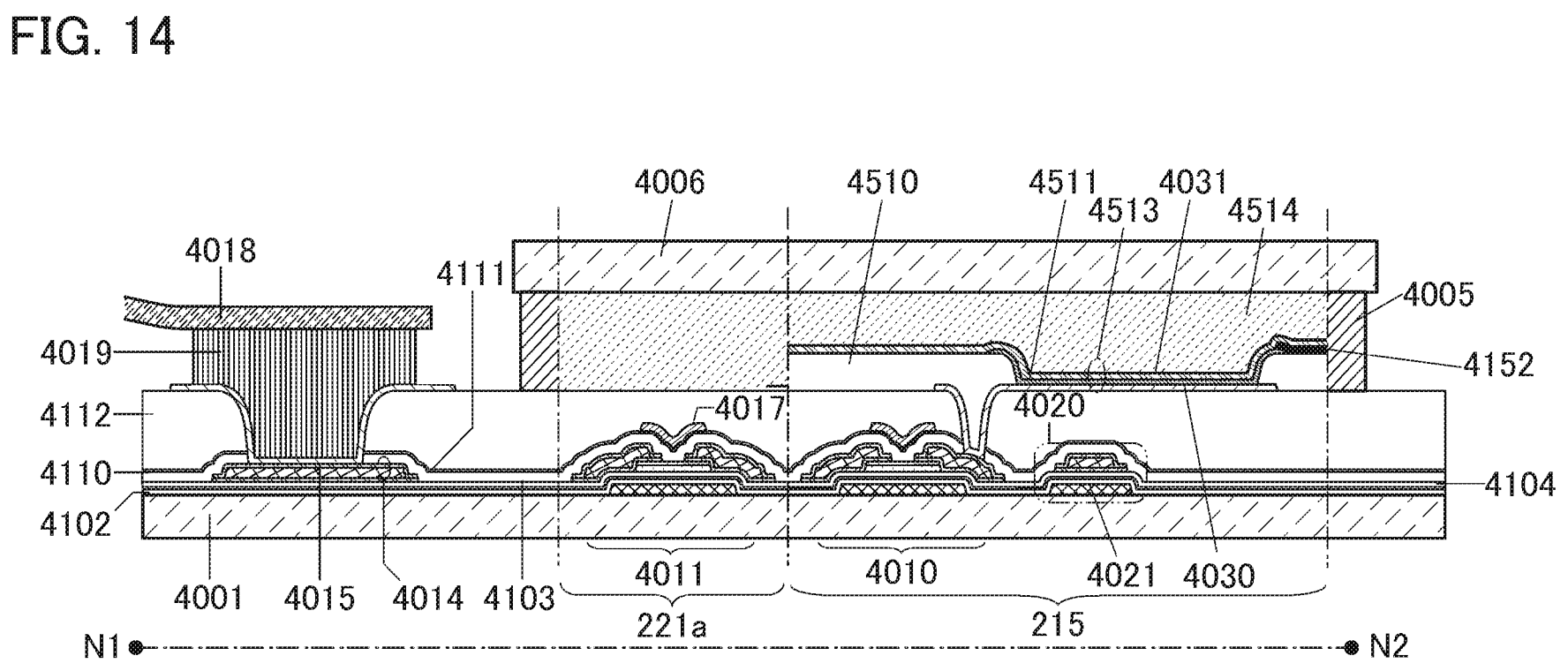
Figure 15:
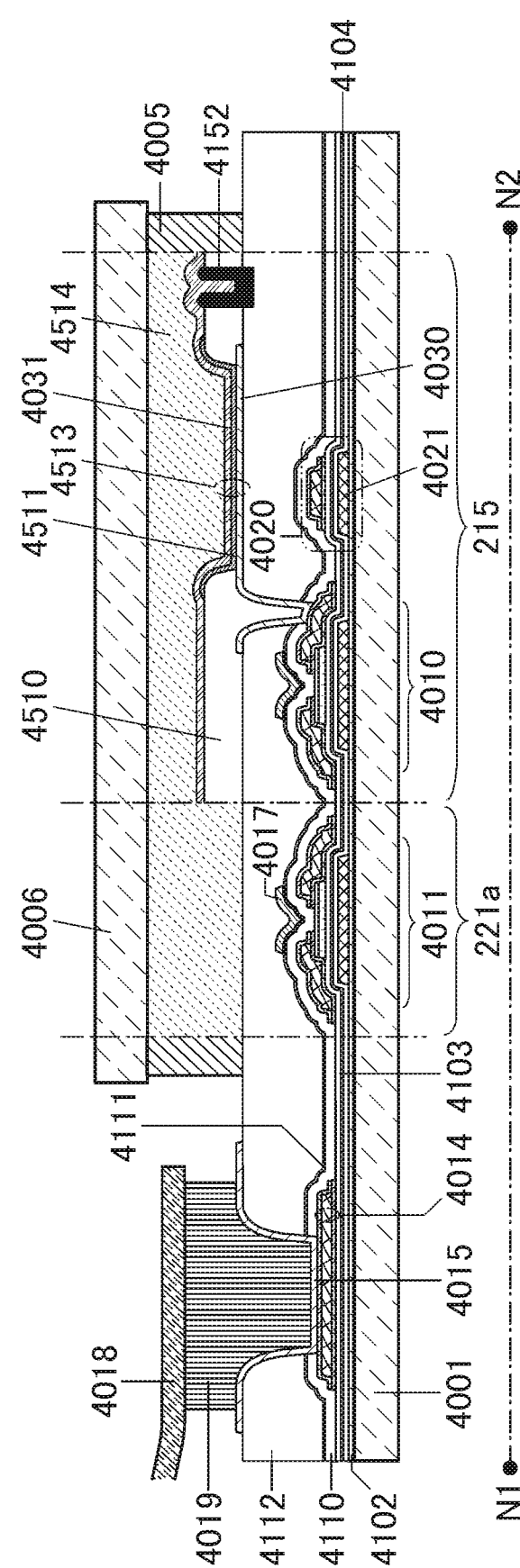
FIG. 15 is a diagram illustrating a display device.

FIG. 14 is a cross-sectional view of a portion which is taken along the dotted line N1-N2 in FIG. 13B, in the display device in which an auxiliary wiring is placed over the insulating layer covering end portions of pixel electrodes, as described in Embodiment 1. FIG. 15 is a cross-sectional view of a portion which is taken along the dotted line N1-N2 in FIG. 13B, in the display device which includes a groove portion or an opening portion, in which an auxiliary wiring is provided, in an insulating layer covering end portions of pixel electrodes, as described in Embodiment 2.

Display devices illustrated in FIG. 14 and FIG. 15 each include an electrode 4015, and the electrode 4015 is electrically connected to a terminal included in an FPC 4018 through an anisotropic conductive layer 4019. In FIG. 14 and FIG. 15, the electrode 4015 is electrically connected to a wiring 4014 in an opening formed in an insulating layer 4112, an insulating layer 4111, and an insulating layer 4110.

The electrode 4015 is formed of the same conductive layer as a pixel electrode 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors, and the transistor 4010 included in the display portion 215 and the transistor 4011 included in the scan line driver circuit 221a are illustrated as an example. Note that in the examples shown in FIG. 14 and FIG. 15, the transistors 4010 and the transistors 4011 are bottom-gate transistors but may be top-gate transistors.

The insulating layer 4112 is provided over the transistor 4010 and the transistor 4011. In addition, a partition wall 4510 is formed over the insulating layer 4112.

The partition wall 4510 is formed using an organic insulating material or an inorganic insulating material. It is particularly preferable that a photosensitive resin material be used, and an opening portion be formed over the pixel electrode 4030 such that a side surface of the opening portion is formed to be an inclined surface having continuous curvature.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display device further includes a capacitor 4020. The capacitor 4020 includes an electrode 4021 formed in the same step as a gate electrode of the transistor 4010, an insulating layer 4103, and an electrode formed in the same step as the source electrode and the drain electrode. The capacitor 4020 is not limited to having this structure and may be formed using another conductive layer and another insulating layer.

The display device further includes the insulating layer 4111 and an insulating layer 4104. For the insulating layer 4111 and the insulating layer 4104, insulating layers through which an impurity element does not easily pass are used. A semiconductor layer of the transistor is sandwiched between the insulating layer 4111 and the insulating layer 4104, so that entry of impurities from the outside can be prevented.

The transistor 4010 provided in the display portion 215 is electrically connected to the light-emitting element. As the light-emitting element, for example, an EL device that utilizes electroluminescence can be employed. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and a light-emitting compound contained in the EL layer emits light.

As the EL device, an organic EL device or an inorganic EL device can be used, for example. Note that an LED (including a micro LED), which uses a compound semiconductor as a light-emitting material, is an EL element, and can be also used.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. The dispersion-type inorganic EL device includes a light-emitting layer where particles of a light-emitting material are dispersed in a binder, and its light emission mechanism is donor-acceptor recombination type light emission that utilizes a donor level and an acceptor level. The thin-film inorganic EL device has a structure where a light-emitting layer is sandwiched between dielectric layers, which are further sandwiched between electrodes, and its light emission mechanism is localization type light emission that utilizes inner-shell electron transition of metal ions. Note that the description is made here using an organic EL device as the light-emitting element.

A black matrix (a light-blocking layer); a coloring layer (a color filter); an optical member (an optical substrate) such as a polarizing member, a retardation member, or an anti-reflection member; or the like may be provided as appropriate if needed.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. A stacked-layer film containing a material of the coloring layer can also be used for the light-blocking layer. For example, a stacked-layer structure of a film containing a material of a coloring layer which transmits light of a certain color and a film containing a material of a coloring layer which transmits light of another color can be employed. The use of the same material for the coloring layer and the light-blocking layer is preferable, in which case the same apparatus can be used and the process can be simplified.

Examples of a material that can be used for the coloring layer include a metal material, a resin material, and a resin material containing a pigment or a dye. The light-blocking layer and the coloring layer can be formed by, for example, an inkjet method or the like.

A light-emitting element 4513 that is a display element is electrically connected to the transistor 4010 provided in the display portion 215. Note that the light-emitting element 4513 of one embodiment of the present invention has a stacked-layer structure of the pixel electrode 4030, a light-emitting layer 4511, and a common electrode 4031. Furthermore, the common electrode 4031 is electrically connected to an auxiliary wiring 4152 formed in a region overlapping with the partition wall 4510. Note that the structure of one embodiment of the present invention is not limited to the structure in FIG. 14 and FIG. 15, and a structure in which the auxiliary wiring 4152 and the light-emitting layer 4511 are not in contact with each other may be employed. Alternatively, the auxiliary wiring 4152 may be formed over the partition wall 4510 so that the auxiliary wiring 4152 is in contact with the top surface and a side surface of the common electrode 4031 and a side surface of the light-emitting layer 4511.

The light-emitting layer 4511 may be formed using a single layer or may be formed such that a plurality of layers are stacked.

The emission color of the light-emitting element 4513 can be white, red, green, blue, cyan, magenta, yellow, or the like depending on the material included in the light-emitting layer 4511.

Note that the light-emitting layer 4511 may contain an inorganic compound such as quantum dots. For example, when used for the light-emitting layer, the quantum dots can function as a light-emitting material.

A protective layer may be formed over the common electrode 4031 and the partition wall 4510 in order to prevent entry of oxygen, hydrogen, moisture, carbon dioxide, and the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a $\lambda/4$ plate or a $\lambda/2$ plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

In addition, when the light-emitting element has a microcavity structure, light with high color purity can be extracted. Furthermore, when a microcavity structure and a color filter are used in combination, the glare can be reduced and visibility of a displayed image can be increased.

For each of the pixel electrode 4030 and the common electrode 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

Each of the pixel electrode 4030 and the common electrode 4031 can also be formed using one or more kinds of a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof, and a metal nitride thereof.

Alternatively, the pixel electrode 4030 and the common electrode 4031 can be formed using a conductive composition including a conductive high molecule (also referred to as a conductive polymer). As the conductive high molecule, a Tc-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

This embodiment can be implemented in an appropriate combination with the structures described in the other embodiments.

Embodiment 4

In this embodiment, examples of transistors that can be used as the transistors described in the above embodiments are described with reference to drawings.

The display device of one embodiment of the present invention can be manufactured using a transistor with any of various structures, such as a bottom-gate transistor or a top-gate transistor. Therefore, a material of a semiconductor layer and the structure of a transistor can be easily changed depending on the existing production line.

Note that there is no particular limitation on a semiconductor material, which is used for the semiconductor layer of the transistor, and the crystallinity thereof. Either an amorphous semiconductor or a semiconductor having crystallinity (a microcrystalline semiconductor, a polycrystalline semiconductor, a single crystal semiconductor, or a semiconductor partly including crystal regions) may be used. Note that the use of a semiconductor having crystallinity is preferable, in which case deterioration of the transistor characteristics can be inhibited.

For example, silicon, germanium, or the like can be used as the semiconductor material used for the semiconductor layer of the transistor. Alternatively, a compound semiconductor such as silicon carbide, gallium arsenide, a metal oxide, or a nitride semiconductor, an organic semiconductor, or the like can be used.

In addition, polycrystalline silicon (polysilicon), amorphous silicon, or the like can be used as a semiconductor material used for the transistor, for example. Furthermore, an oxide semiconductor, which is a kind of metal oxide, can be used as a semiconductor material used for the transistor.

Note that a metal oxide used as the oxide semiconductor preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

For example, an In-M-Zn oxide containing indium, an element M, and zinc can be used as the metal oxide. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element Min some cases.

Note that in this specification and the like, a metal oxide containing nitrogen is also collectively referred to as a metal oxide in some cases. A metal oxide containing nitrogen may be referred to as a metal oxynitride.

[Bottom-Gate Transistor]

FIG. 16A is a cross-sectional view of a channel-protective transistor 810, which is a kind of bottom-gate transistor, in a channel length direction. In FIG. 16A, the transistor 810 is formed over a substrate 771. In addition, the transistor 810 includes an electrode 746 over the substrate 771 with an insulating layer 772 therebetween. The transistor 810 further includes a semiconductor layer 742 over the electrode 746 with an insulating layer 726 therebetween. The electrode 746 can function as a gate electrode. The insulating layer 726 can function as a gate insulating layer.

In addition, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b.

In addition, the transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. In a region where oxygen vacancies are generated in the semiconductor layer 742, the carrier concentration is increased; thus, the region becomes to have n-type conductivity to be an n-type region (n$^+$ layer). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region of the transistor.

The insulating layer 729 is preferably formed using a material that has a function of preventing or reducing diffusion of impurities into the transistor from the outside. Note that the insulating layer 729 can be omitted as necessary.

An electrode 723 that can function as a back gate electrode is provided over the insulating layer 729. The electrode 723 can be formed using a material and a method similar to those for the electrode 746. Note that a structure in which the electrode 723 is not provided may be employed.

In general, a back gate electrode is formed using a conductive layer and positioned so that a channel formation region in a semiconductor layer is sandwiched between the gate electrode and the back gate electrode. Thus, the back gate electrode can function in a manner similar to that of the gate electrode. The potential of the back gate electrode may be the same as the potential of the gate electrode or may be a ground potential (GND potential) or a given potential. In addition, when the potential of the back gate electrode is changed without synchronization and independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". In the transistor 810, for example, in the case where the electrode 723 is referred to as a "gate electrode", the electrode 746 is referred to as a "back gate electrode". In the case where the electrode 723 is used as a "gate electrode", the transistor 810 can be regarded as a kind of top-gate transistor. Furthermore, in some cases, one of the electrode 746 and the electrode 723 is referred to as a "first gate electrode," and the other is referred to as a "second gate electrode."

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in a film thickness direction; thus, the amount of transferred carriers is increased. As a result, the on-state current of the transistor 810 is increased and the field-effect mobility is increased.

Therefore, the transistor 810 is a transistor having high on-state current for its occupation area. That is, the occupation area of the transistor 810 can be small for required on-state current.

In addition, the gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

Furthermore, when the back gate electrode is formed using a light-blocking conductive film, light can be prevented from entering the semiconductor layer from the back gate electrode side. Consequently, photodegradation of the semiconductor layer can be prevented, and degradation in electrical characteristics of the transistor, such as a shift in the threshold voltage, can be prevented.

FIG. 16B is a cross-sectional view of a channel-protective transistor 820, which has a structure different from FIG. 16A, in a channel length direction. The transistor 820 has substantially the same structure as the transistor 810 but is different from the transistor 810 in that the insulating layer 741 covers end portions of the semiconductor layer 742. In addition, the semiconductor layer 742 is electrically connected to the electrode 744a through an opening portion formed by selectively removing part of the insulating layer 741 that overlaps with the semiconductor layer 742. Furthermore, the semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

Furthermore, the distance between the electrode 744a and the electrode 746 and the distance between the electrode 744b and the electrode 746 are longer in the transistor 820 than in the transistor 810. Thus, parasitic capacitance generated between the electrode 744a and the electrode 746 can be reduced. Moreover, the parasitic capacitance generated between the electrode 744b and the electrode 746 can be reduced.

FIG. 16C is a cross-sectional view of a channel-etched transistor 825, which is a kind of bottom-gate transistor, in a channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

[Top-Gate Transistor]

Figure 17A:
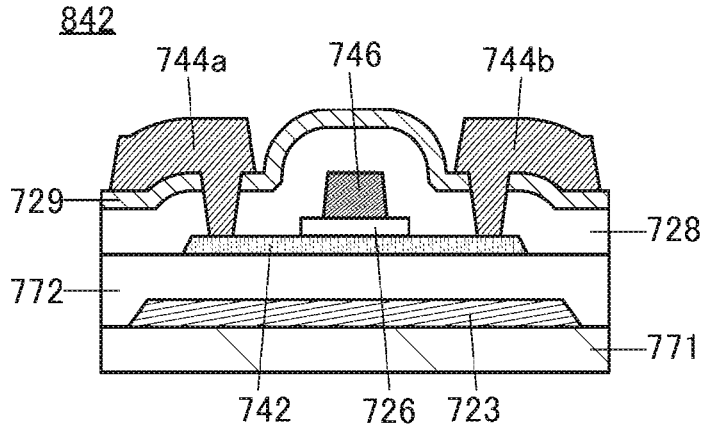
FIG. 17A to FIG. 17C are diagrams illustrating transistors.

A transistor 842 illustrated in FIG. 17A is a type of top-gate transistor. The electrode 744a and the electrode 744b are electrically connected to the semiconductor layer 742 through opening portions formed in the insulating layer 728 and the insulating layer 729.

In addition, part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 that overlaps with the insulating layer 726 but does not overlap with the electrode 746.

In addition, the transistor 842 includes the electrode 723 that is formed over the substrate 771. The electrode 723 includes a region overlapping with the semiconductor layer 742 with the insulating layer 772 therebetween. The electrode 723 can function as a back gate electrode. Note that a structure in which the electrode 723 is not provided may be employed.

Figure 17B:
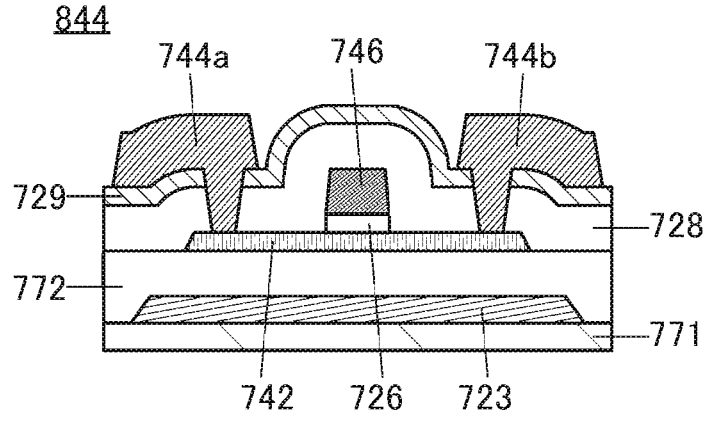
Figure 17C:
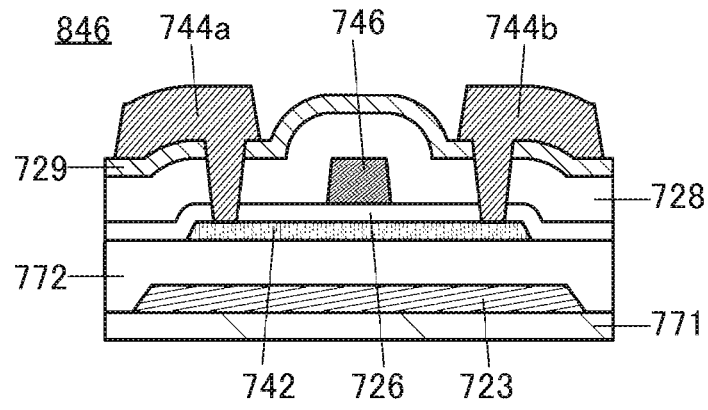

As in a transistor 844 illustrated in FIG. 17B, the insulating layer 726 in a region that does not overlap with the electrode 746 may be completely removed. Alternatively, the insulating layer 726 may be left as in a transistor 846 illustrated in FIG. 17C.

Figure 18A:
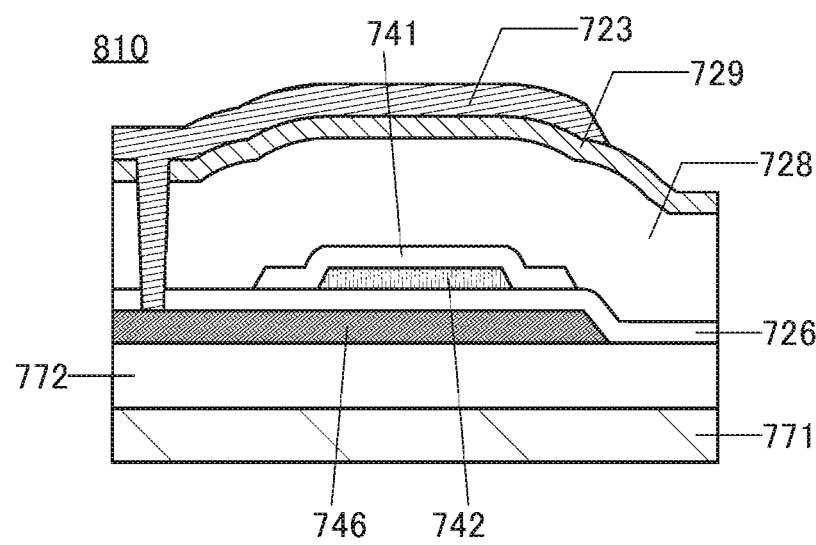
FIG. 18A and FIG. 18B are diagrams illustrating the transistors.
Figure 18B:
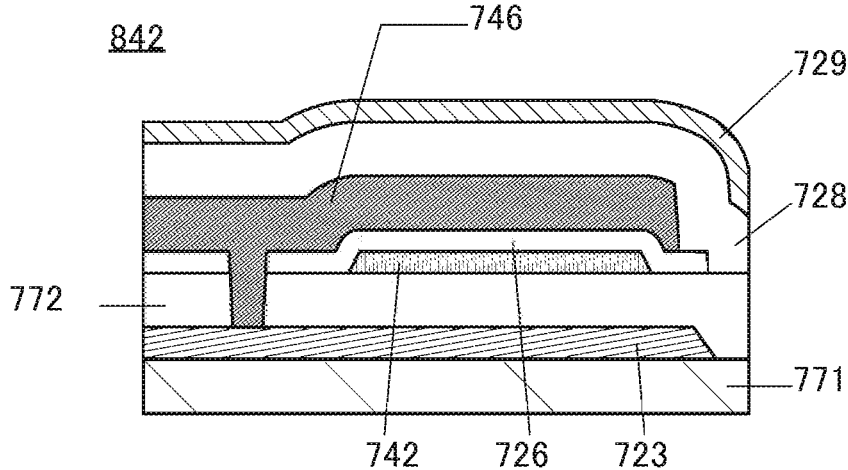

FIG. 18A illustrates a cross-sectional view of the transistor 810 in a channel width direction, and FIG. 18B illustrates a cross-sectional view of the transistor 842 in a channel width direction.

In each of the structures illustrated in FIG. 18A and FIG. 18B, the gate electrode is connected to the back gate electrode, and the potentials of the gate electrode and the back gate electrode are equal to each other. In addition, the semiconductor layer 742 is sandwiched between the gate electrode and the back gate electrode.

The length of each of the gate electrode and the back gate electrode in the channel width direction is larger than the length of the semiconductor layer 742 in the channel width direction. In the channel width direction, the entire semiconductor layer 742 is covered with the gate electrode or the back gate electrode with insulating layers sandwiched therebetween.

This structure enables the semiconductor layer 742 included in the transistor to be electrically surrounded by electric fields of the gate electrode and the back gate electrode.

A transistor device structure in which the semiconductor layer 742 where the channel formation region is formed is electrically surrounded by electric fields of the gate electrode and the back gate electrode in this manner can be referred to as a Surrounded channel (S-channel) structure.

With the S-channel structure, an electric field for inducing a channel can be effectively applied to the semiconductor layer 742 by one or both of the gate electrode and the back gate electrode, which enables the transistor to have an improved current drive capability and high on-state current characteristics. In addition, the transistor can be miniaturized because the on-state current can be increased. The S-channel structure can also increase the mechanical strength of the transistor.

Note that a structure where the gate electrode and the back gate electrode are not connected to each other and are supplied with different potentials may be employed. For example, supplying a constant potential to the back gate electrode can control the threshold voltage of the transistor.

This embodiment can be combined with the other embodiments as appropriate. In the case where a plurality of structure examples are described in one embodiment in this specification, the structure examples can be combined as appropriate.

Embodiment 5

In this embodiment, electronic devices of one embodiment of the present invention will be described with reference to drawings.

An electronic device of this embodiment includes the display device of one embodiment of the present invention. Resolution, definition, and sizes of the display device of one embodiment of the present invention are easily increased. Thus, the display device of one embodiment of the present invention can be used for a display portion of a variety of electronic devices.

In addition, the display device of one embodiment of the present invention can be manufactured at low cost, which leads to a reduction in manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display device of one embodiment of the present invention can be favorably used for an electronic device including a medium-to-large-sized display portion, in which case a voltage drop of a cathode can be inhibited by an auxiliary wiring.

The definition of the display device of one embodiment of the present invention is preferably as extremely high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the display device with such high definition and/or high resolution, the electronic device can give higher realistic sensation, sense of depth, and the like in personal use such as portable use or home use.

The electronic device of this embodiment can be incorporated along a curved surface of an inside wall or an outside wall of a house or a building or the interior or the exterior of a car.

The electronic device of this embodiment may include an antenna. When a signal is received by the antenna, the electronic device can display a video, data, and the like on a display portion. When the electronic device includes the antenna and a secondary battery, the antenna may be used for contactless power transmission. In addition, the electronic device of this embodiment may include a touch sensor.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

FIG. 19A shows an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 19A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 19B shows an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

FIG. 19C and FIG. 19D show examples of digital signage.

Digital signage 7300 shown in FIG. 19C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 19D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 19C and FIG. 19D.

A larger area of the display portion 7000 can increase the amount of data that can be provided at a time. The larger display portion 7000 attracts more attention, so that the effectiveness of the advertisement can be increased, for example.

A touch panel is preferably used in the display portion 7000, in which case intuitive operation by a user is possible in addition to display of an image or a moving image on the display portion 7000. Moreover, for an application for providing information such as route information or traffic information, usability can be enhanced by intuitive operation.

As shown in FIG. 19C and FIG. 19D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

This embodiment can be combined with the other embodiments as appropriate.

REFERENCE NUMERALS

100: display device, 101: substrate, 110B: light-emitting element, 110G: light-emitting element, 110R: light-emitting element, 111: pixel electrode, 112B: EL layer, 112Bf: EL film, 112G: EL layer, 112Gf: EL film, 112R: EL layer, 112Rf: EL film, 113: common electrode, 113*a*: EL layer, 113*b*: EL layer, 113B: common electrode, 113*c*: EL layer, 113G: common electrode, 113R: common electrode, 115: auxiliary wiring, 115*f*: conductive film, 121: protective layer, 131: insulating layer, 143*a*: resist mask, 143*b*: resist mask, 143*c*: resist mask, 150: resist mask, 200: display device, 215: display portion, 221*a*: scan line driver circuit, 231*a*: signal line driver circuit, 232*a*: signal line driver circuit, 241*a*: common line driver circuit, 330: pixel, 332: peripheral circuit region, 333: peripheral circuit region, 335: display region, 336: wiring, 337: wiring, 351: transistor, 370: light-emitting element, 431: pixel circuit, 432: display element, 433: capacitor, 434: transistor, 435: node, 436: transistor, 437: node, 723: electrode, 726: insulating layer, 728: insulating layer, 729: insulating layer, 741: insulating layer, 742: semiconductor layer, 744*a*: electrode, 744*b*: electrode, 746: electrode, 771: substrate, 772: insulating layer, 810: transistor, 820: transistor, 825: transistor, 842: transistor, 844: transistor, 846: transistor, 4001: substrate, 4005: sealant, 4006: substrate, 4010: transistor, 4011: transistor, 4014: wiring, 4015: electrode, 4017: electrode, 4018: FPC, 4019: anisotropic conductive layer, 4020: capacitor, 4021: electrode, 4030: pixel electrode, 4031: common electrode, 4041: printed circuit board, 4042: integrated circuits, 4102: insulating layer, 4103: insulating layer, 4104: insulating layer, 4110: insulating layer, 4111: insulating layer, 4112: insulating layer, 4152: auxiliary wiring, 4510: partition wall, 4511: light-emitting layer, 4513: light-emitting element, 4514: filler, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal

The invention claimed is:

1. A display device comprising:
a first pixel and a second pixel placed to be adjacent to each other; and
an auxiliary wiring between the first pixel and the second pixel, wherein the first pixel comprises a first light-emitting element comprising a first electrode, a first EL layer over the first electrode, and an electrode having light-transmitting property with respect to visible light over the first EL layer, wherein the second pixel comprises a second light-emitting element comprising a second electrode, a second EL layer over the second electrode, and the electrode having light-transmitting property with respect to visible light over the second EL layer, wherein a first insulating layer covers an end portion of the first electrode and an end portion of the second electrode and is positioned below the first EL layer and below the second EL layer, wherein the first insulating layer comprises a groove portion, wherein the auxiliary wiring comprises a region in contact with an inner wall of the groove portion, wherein each of a top surface of the first EL layer, a top surface of the second EL layer, and a top surface of the auxiliary wiring comprises a region in contact with the electrode having light-transmitting property, and wherein the region of the top surface of the auxiliary wiring includes a portion located over a top surface of the first insulating layer.

2. A display device comprising:
a first pixel and a second pixel placed to be adjacent to each other; and
an auxiliary wiring between the first pixel and the second pixel, wherein the first pixel comprises a first light-emitting element comprising a first electrode, a first EL layer over the first electrode, and an electrode having light-transmitting property with respect to visible light over the first EL layer, wherein the second pixel comprises a second light-emitting element comprising a second electrode, a second EL layer over the second electrode, and the electrode having light-transmitting property with respect to visible light over the second EL layer, wherein a first insulating layer covers an end portion of the first electrode and an end portion of the second electrode and is positioned below the first EL layer and below the second EL layer, wherein the first insulating layer comprises an opening portion, wherein the auxiliary wiring comprises a first region in contact with an inner wall of the opening portion, wherein each of a top surface of the first EL layer, a top surface of the second EL layer, and a top surface of the auxiliary wiring comprises a region in contact with the electrode having light-transmitting property, and wherein the region of the top surface of the auxiliary wiring includes a portion located over a top surface of the first insulating layer.

3. The display device according to claim 2,
wherein each of the first electrode, the second electrode, and the first insulating layer is in contact with a top surface of a second insulating layer, wherein the second insulating layer comprises a groove portion overlapped with the opening portion of the first insulating layer, and wherein the auxiliary wiring comprises a second region in contact with an inner wall of the groove portion.

4. The display device according to claim 3,
wherein a first layer is provided below the groove portion of the second insulating layer, and wherein the auxiliary wiring comprises a third region in contact with the first layer in the groove portion.

5. The display device according to claim 1, wherein the auxiliary wiring has higher conductivity than the second electrode.

6. The display device according to claim 2, wherein the auxiliary wiring has higher conductivity than the second electrode.

7. The display device according to claim 2, wherein the opening portion of the first insulating layer is filled with the auxiliary wiring.

8. The display device according to claim 1, wherein the groove portion of the first insulating layer is filled with the auxiliary wiring.

9. The display device according to claim 3, wherein the groove portion of the second insulating layer is filled with the auxiliary wiring.

10. The display device according to claim 3, wherein the opening portion of the first insulating layer and the groove portion of the second insulating layer are filled with the auxiliary wiring.

11. The display device according to claim 1, wherein the first pixel comprises a first transistor electrically connected to the first electrode.

12. The display device according to claim 2, wherein the first pixel comprises a first transistor electrically connected to the first electrode.

13. The display device according to claim 1, wherein the auxiliary wiring comprises at least one selected from aluminum, titanium, tantalum, tungsten, molybdenum, chromium, neodymium, scandium, nickel, and copper.

14. The display device according to claim 2, wherein the auxiliary wiring comprises at least one selected from aluminum, titanium, tantalum, tungsten, molybdenum, chromium, neodymium, scandium, nickel, and copper.

* * * * *